US012593732B2

(12) United States Patent
Chang et al.

(10) Patent No.: US 12,593,732 B2
(45) Date of Patent: Mar. 31, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Kai-Fung Chang, Hsinchu (TW); Chin-Wei Liang, Hsinchu (TW); Sheng-Feng Weng, Hsinchu (TW); Ming-Yu Yen, Hsinchu (TW); Cheyu Liu, Hsinchu (TW); Hung-Chih Chen, Hsinchu (TW); Yi-Yang Lei, Hsinchu (TW); Ching-Hua Hsieh, Hsinchu (TW); Hung-Chou Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 493 days.

(21) Appl. No.: 18/099,038

(22) Filed: Jan. 19, 2023

(65) Prior Publication Data

US 2024/0186308 A1 Jun. 6, 2024

Related U.S. Application Data

(60) Provisional application No. 63/429,306, filed on Dec. 1, 2022.

(51) Int. Cl.
H01L 25/18 (2023.01)
H01L 21/56 (2006.01)
(Continued)

(52) U.S. Cl.
CPC .............. H01L 25/18 (2013.01); H01L 21/56 (2013.01); H01L 23/3185 (2013.01);
(Continued)

(58) Field of Classification Search
CPC ..... H01L 25/18; H01L 21/56; H01L 23/3185; H01L 23/49816; H01L 23/5384;
(Continued)

(56) References Cited

U.S. PATENT DOCUMENTS

2018/0061741 A1* 3/2018 Beyne ..................... H01L 24/97
2018/0138151 A1* 5/2018 Shih ......................... H01L 25/50
(Continued)

*Primary Examiner* — Thanh Y. Tran

(74) *Attorney, Agent, or Firm* — Birch, Stewart, Kolasch & Birch, LLP

(57) ABSTRACT

A semiconductor device and a manufacturing method thereof are provided. The semiconductor device includes a redistribution layer (RDL) module, a first semiconductor module, an interconnection module, a second semiconductor module and a molding material. The first semiconductor module is disposed on the RDL module. The interconnection module is disposed on the RDL module. The second semiconductor module is disposed on the interconnection module. The molding material covers the RDL module and surrounds the first semiconductor module and the second semiconductor module. A top surface of the first semiconductor module and a top surface of the second semiconductor module are exposed by the molding material.

20 Claims, 28 Drawing Sheets

100

(51) Int. Cl.
| | |
|---|---|
| *H01L 23/00* | (2006.01) |
| *H01L 23/31* | (2006.01) |
| *H01L 23/498* | (2006.01) |
| *H01L 23/538* | (2006.01) |
| *H01L 25/00* | (2006.01) |

(52) U.S. Cl.
CPC .... *H01L 23/49816* (2013.01); *H01L 23/5384* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 25/50* (2013.01); *H01L 2224/13147* (2013.01); *H01L 2224/16235* (2013.01); *H01L 2224/32225* (2013.01); *H01L 2224/73204* (2013.01); *H01L 2224/81* (2013.01); *H01L 2224/83* (2013.01); *H01L 2224/9211* (2013.01)

(58) Field of Classification Search
CPC ......... H01L 24/13; H01L 24/16; H01L 24/32; H01L 24/73; H01L 24/81; H01L 24/83; H01L 2224/16235; H01L 24/92; H01L 25/50

See application file for complete search history.

(56) References Cited

U.S. PATENT DOCUMENTS

| | | | | |
|---|---|---|---|---|
| 2019/0096851 | A1* | 3/2019 | Liao | H01L 24/17 |
| 2020/0075569 | A1* | 3/2020 | Jeng | G03F 7/203 |
| 2020/0091029 | A1* | 3/2020 | Jeng | H01L 21/4871 |
| 2020/0105684 | A1* | 4/2020 | Chang | H01L 23/3135 |
| 2020/0312760 | A1* | 10/2020 | Park | H01L 21/4853 |
| 2021/0375708 | A1* | 12/2021 | Kuo | H01L 21/486 |
| 2022/0223534 | A1* | 7/2022 | Lin | H01L 23/3135 |
| 2022/0310577 | A1* | 9/2022 | Lee | H01L 23/5389 |
| 2022/0320053 | A1* | 10/2022 | Lee | H01L 23/5389 |
| 2022/0328395 | A1* | 10/2022 | Chen | H01L 23/5384 |
| 2022/0415737 | A1* | 12/2022 | Wu | H01L 25/0655 |

* cited by examiner 132
172
171

131
135
134
133
132
}130

172
171

181
182

260
230
221
220
210

231
211
250
230
220
210

420

420

410s'
411'

421

420s'

410

420

473
472
471

410s

420s

SEMICONDUCTOR DEVICE AND MANUFACTURING METHOD THEREOF

PRIORITY CLAIM AND CROSS-REFERENCE

This application claims the benefit of U.S. provisional application Ser. No. 63/429,306, filed Dec. 1, 2022, the subject matter of which is incorporated herein by reference.

BACKGROUND

The disclosure relates in general to a semiconductor device and a manufacturing method thereof, and more particularly to a semiconductor device integrating at least two semiconductor modules and a manufacturing method thereof.

With the rapid development of electronic devices, a semiconductor technology that integrates multiple modules is developed. However, in this technology, it faces several issues, such as the heat dissipation issue and the process complexity issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
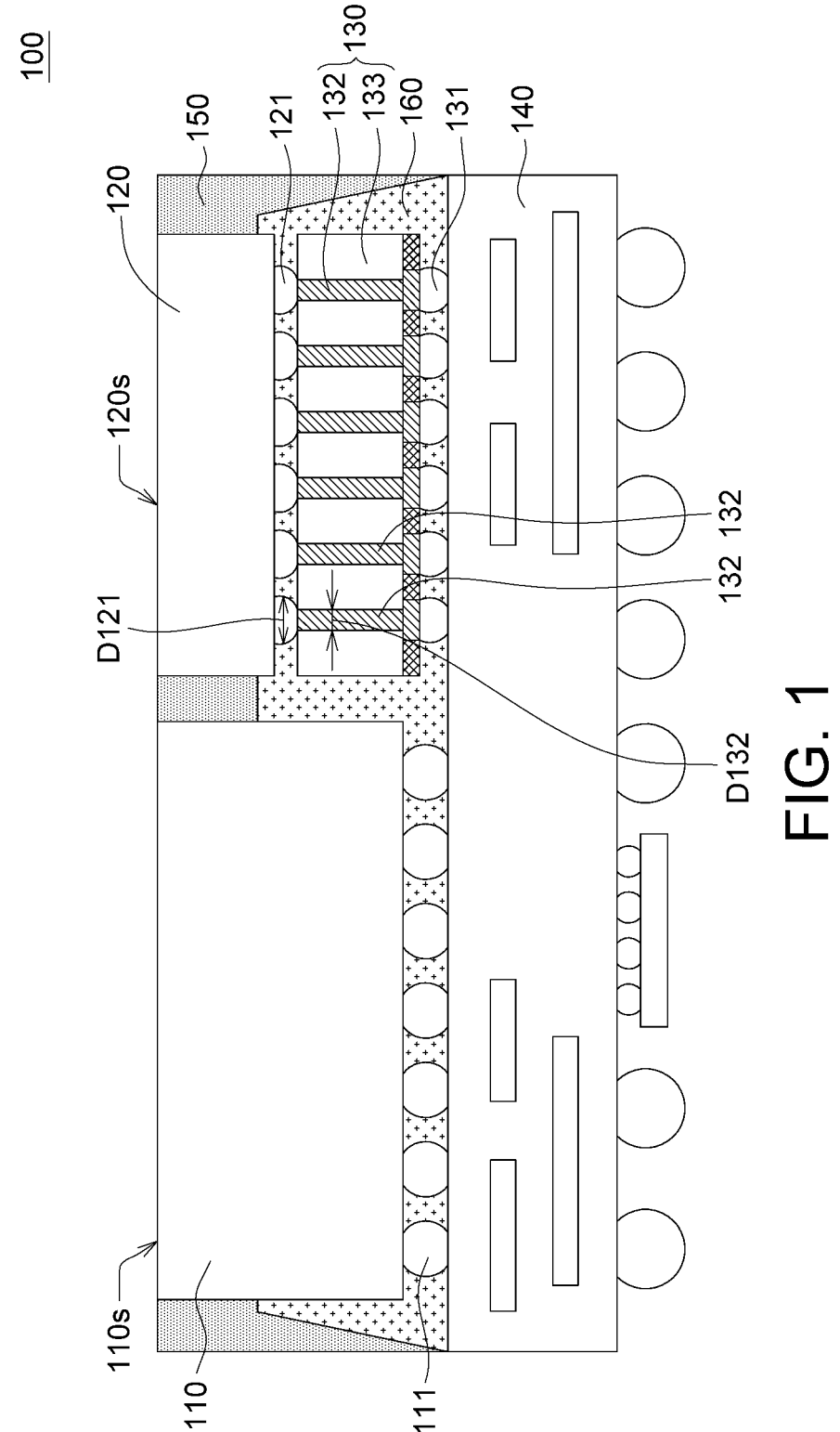
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one module or feature's relationship to another module(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 100 according to one embodiment. The semiconductor device 100 is, for example, an Integrated Fan-Out (InFO) device. The semiconductor device 100 includes a first semiconductor module 110, a second semiconductor module 120, an interconnection module 130, a redistribution layer (RDL) module 140, a molding material 150 and an under-fill material 160. The first semiconductor module 110 could be a memory, such as Dynamic Random Access Memory (DRAM), High Bandwidth Memory (HBM), or a chip, such as a System-on-Chip (SOC) device. The second semiconductor module 120 could be a chip, such as a SOC device, or a memory, such as DRAM, HBM. The interconnection module 130 is, for example, composed of a plurality of conductive pillars 132 and an insulating material 133. The interconnection module 130 is also called TIV (Through InFO Via) die. The RDL module 140 is, for example, composed of a plurality of metal traces and a polymer. The RDL module 140 is used to fan out the circuit paths.

As shown in FIG. 1, the first semiconductor module 110 is disposed on the RDL module 140. The interconnection module 130 is disposed on the RDL module 140. The second semiconductor module 120 is disposed on the interconnection module 130. The molding material 150 covers the RDL module 140 and surrounds the first semiconductor module 110 and the second semiconductor module 120. A top surface 110s of the first semiconductor module 110 and a top surface 120s of the second semiconductor module 120 are exposed by the molding material 150.

Due to the interconnection module 130, the second semiconductor module 120 is elevated, so that the top surface 110s and the top surface 120s are substantially located at the same plane and can be exposed by the molding material 150. As such, the heat generated from the first semiconductor module 110 and the second semiconductor module 120 can be effectively dissipated via the top surface 110s and the top surface 120s.

As shown in FIG. 1, the first semiconductor module 110 is jointed with the RDL module 140 through a plurality of solder balls 111; the second semiconductor module 120 is jointed with the interconnection module 130 through a plurality of solder balls 121; the interconnection module 130 is jointed with the RDL module 140 through a plurality of solder balls 131. Because the first semiconductor module 110, the second semiconductor module 120, the interconnection module 130 and the RDL module 140 are connected through solder joint, so the under-fill material 160 could be used to cover the solder balls 111 connected between the first semiconductor module 110 and the RDL module 140, the solder balls 131 connected between the interconnection module 130 and the RDL module 140, and the solder balls 121 connected between the second semiconductor module 120 and the interconnection module 130. Only one under-fill material 160 is needed to cover those solder balls 111, 121, 131.

As shown in FIG. 1, the interconnection module 130 could be entirely embedded in the under-fill material 160.

The interconnection module 130 has the conductive pillars 132. A diameter D121 of each of the solder balls 121 connected between the second semiconductor module 120 and the interconnection module 130 is larger than a diameter D132 of each of the conductive pillars 132 of the interconnection module 130. Therefore, the solder balls 121 could be firmly jointed with the conductive pillars 132.

Further, the molding material 150 covers the under-fill material 160, part of the first semiconductor module 110 and part of the second semiconductor module 120. In case of the interconnection module 130 is embedded in the under-fill material 160, the molding material 150 is not contacted with the interconnection module 130.

Figure 2A:
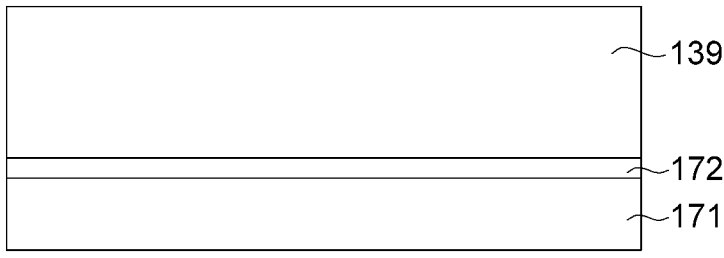
FIGS. 2A to 2K illustrate a manufacturing method of the semiconductor device according to one embodiment.

Please refer to FIGS. 2A to 2K, which illustrate a manufacturing method of the semiconductor device 100 according to one embodiment. As shown in FIG. 2A, a removable adhesive film 172 is disposed on a carrier 171 and a seed layer 139 is form on the removable adhesive film 172. The seed layer 139 is made of conductive material. The removable adhesive film 172 is, for example, a Light-To-Heat-Conversion Release Coating (LTHC+) layer.

Figure 2B:
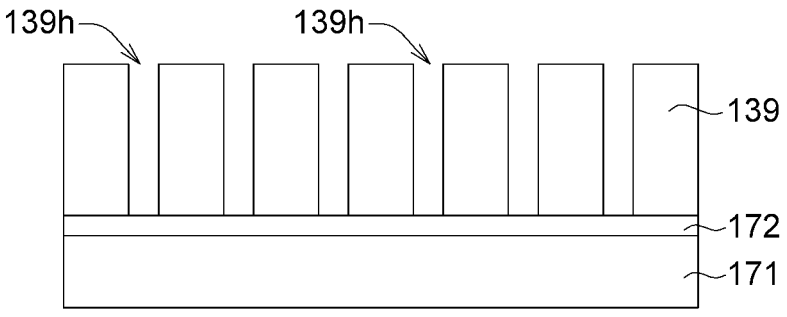

Then, as shown in FIG. 2B, the seed layer 139 is etched to form a plurality of openings 139h.

Figure 2C:
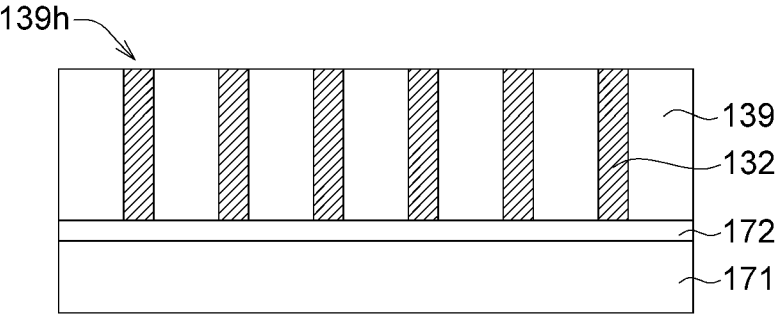

Next, as shown in FIG. 2C, metal is filled in the openings 139h by plating and the conductive pillars 132 are formed.

Figure 2D:
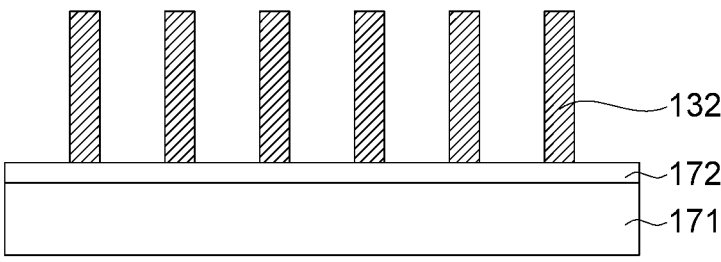

Then, as shown in FIG. 2D, the seed layer 139 (shown in FIG. 2C) is removed by etching and the conductive pillars 132 are remained.

Figure 2E:
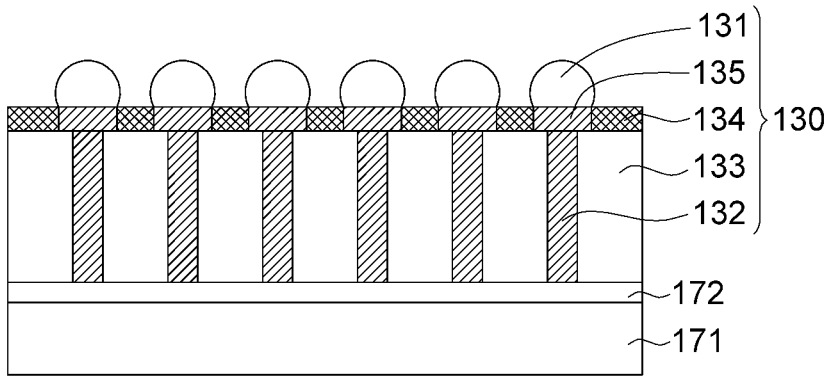

Afterwards, as shown in FIG. 2E, the insulating material 133, such as a molding material, is formed to support the conductive pillars 132. Some of the insulating material 133 may cover the top of the conductive pillars 132 and a grinding process, such as MCG or CMP, may be used to expose the top of the conductive pillars 132. Further, a polymer layer 134 and a plurality of copper bumps 135, are formed on the insulating material 133 and the conductive pillars 132. Moreover, the solder balls 131 are formed on the copper bumps 135. The conductive pillars 132, the insulating material 133, the polymer layer 134 and the copper bumps 135 and the solder balls 131 form the interconnection module 130. In other embodiments, the polymer layer 134 and the copper bumps 135 may be omitted, and the solder balls 131 are directly formed on the top of the conductive pillars 132.

Figure 2F:
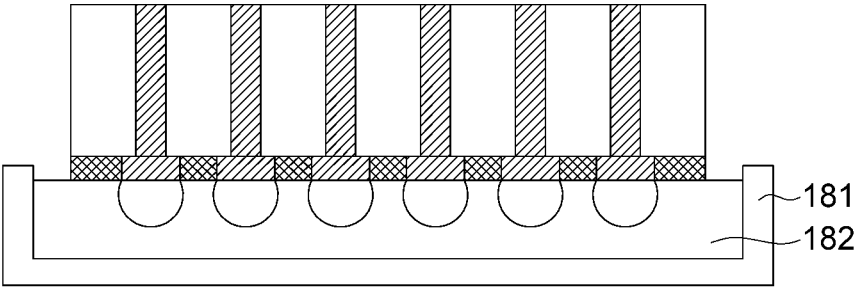

Then, as shown in FIG. 2F, the interconnection module 130 is detached from the removable adhesive film 172 and the carrier 171 and placed on a dicing frame 181 with a dicing tape 182. For example, the removable adhesive film 172 is de-bonded with the interconnection module 130 by laser irradiation.

Figure 2G:
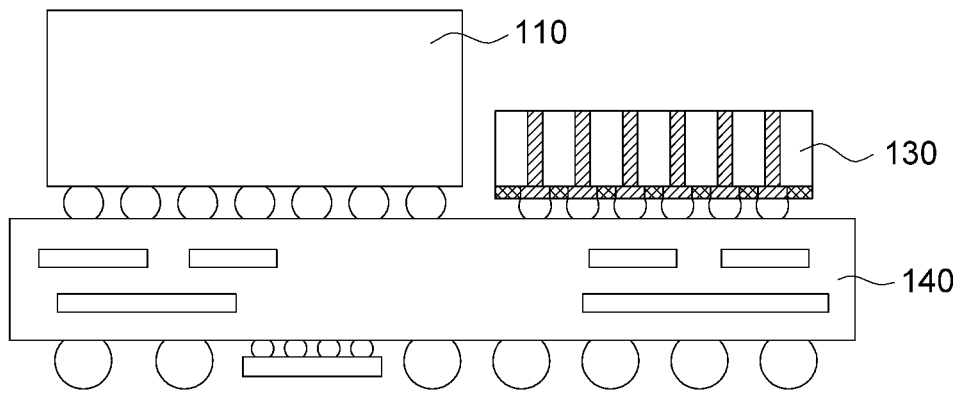

Next, as shown in FIG. 2G, the interconnection module 130 and the first semiconductor module 110 are jointed with the RDL module 140.

Figure 2H:
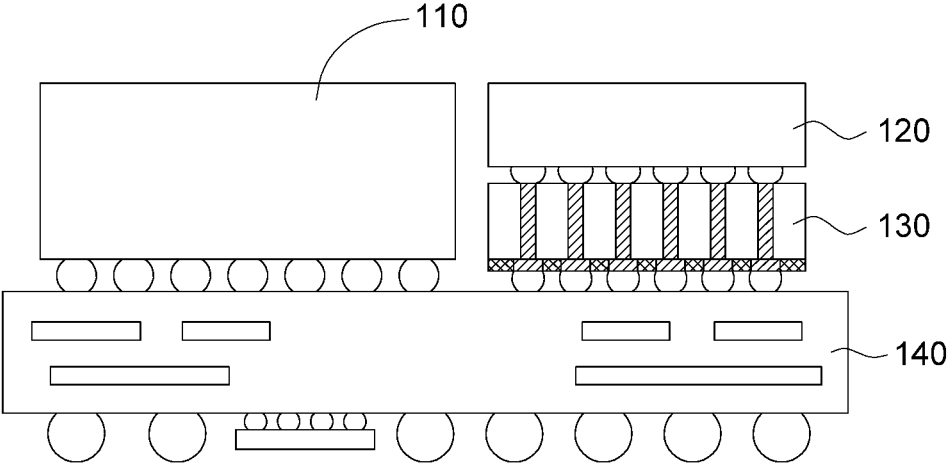

Afterwards, as shown in FIG. 2H, the second semiconductor module 120 is jointed with the interconnection module 130.

Figure 2I:
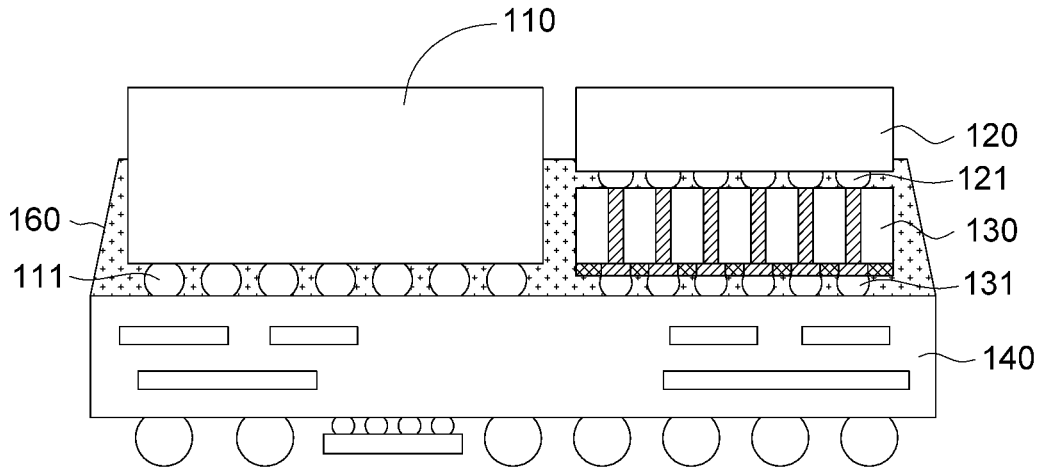

Then, as shown in FIG. 2I, the under-fill material 160 is filled to cover the solder balls 111, 121, 131. The under-fill material 160 fully covers the interconnection module 130 to cover the solder balls 121, 131 connected to two opposite sides of the interconnection module 130.

Figure 2J:
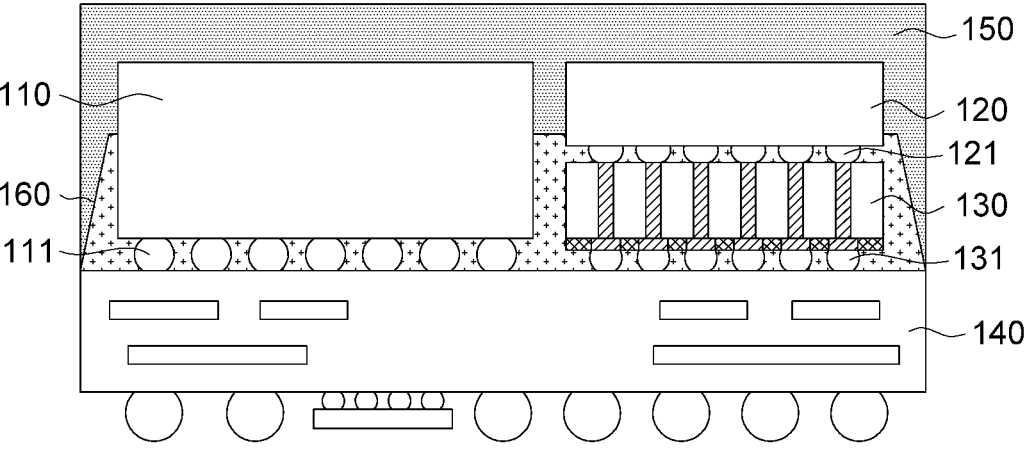

Next, as shown in FIG. 2J, the molding material 150 covers the RDL module 140, the first semiconductor module 110 and the second semiconductor module 120. Because the interconnection module 130 is embedded in the under-fill material 160, the molding material 150 is not contacted with the interconnection module 130.

Figure 2K:
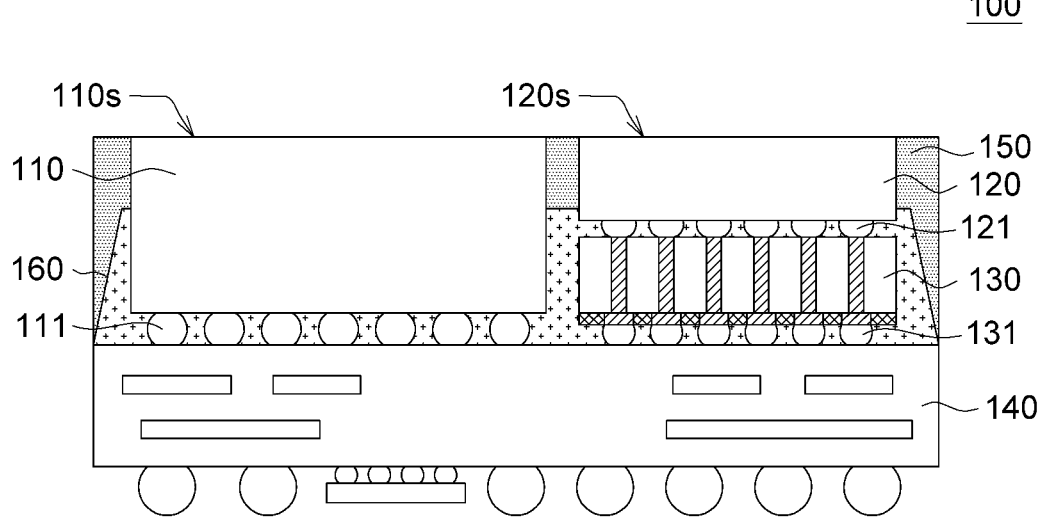

Then, as shown in FIG. 2K, the molding material 150 is grinded to expose the top surface 110s of the first semiconductor module 110 and the top surface 120s of the second semiconductor module 120.

Based on above, the semiconductor device 100 having more than one semiconductor modules is formed. Due to the interconnection module 130, the second semiconductor module 120 is elevated, so that the top surface 110s and the top surface 120s are substantially located at the same plane and can be exposed by the molding material 150. As such, the heat generated from the first semiconductor module 110 and the second semiconductor module 120 can be effectively dissipated via the top surface 110s and the top surface 120s.

Figure 3:
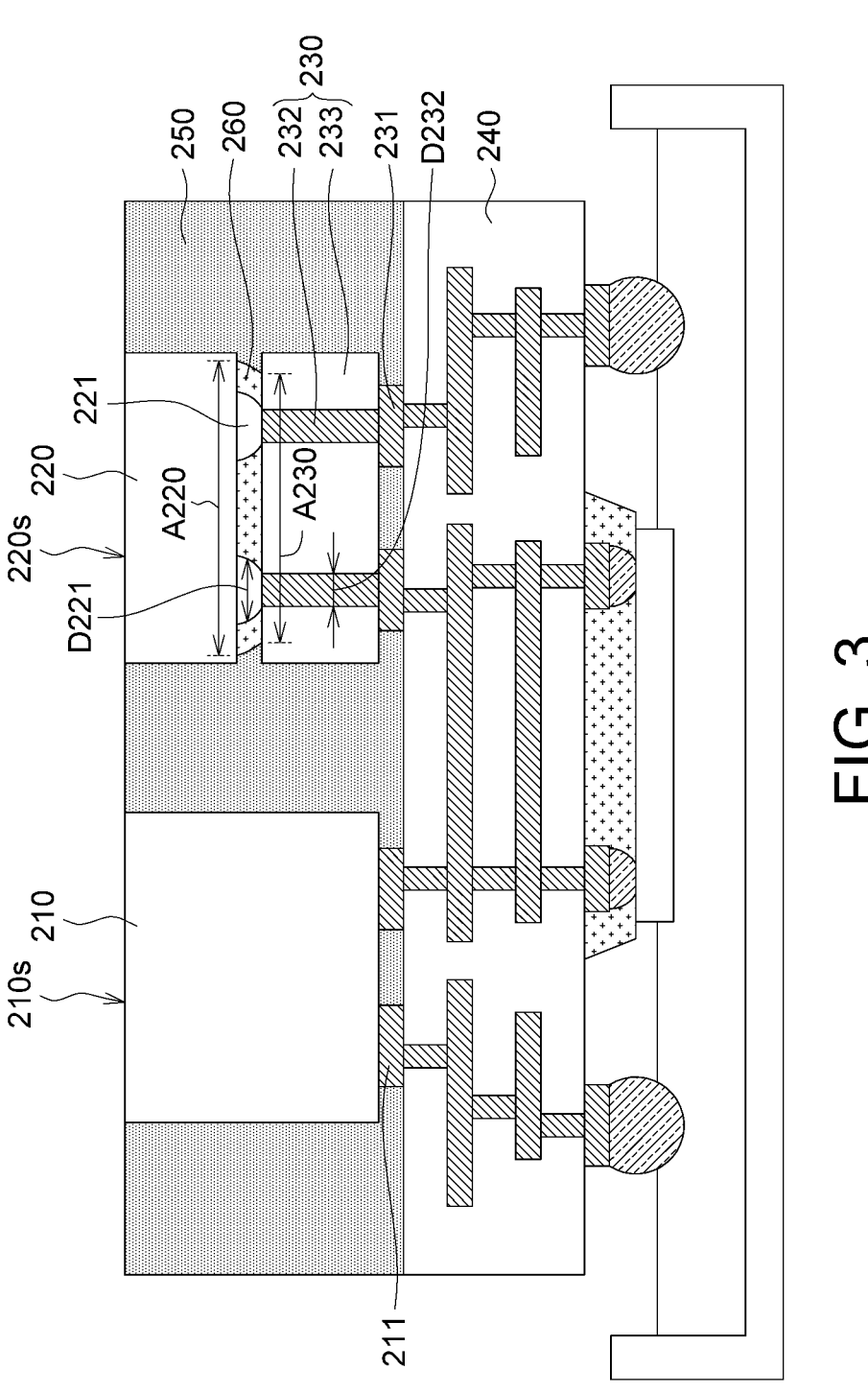
FIG. 3 shows another semiconductor device according to another embodiment.

Please referring to FIG. 3, which shows another semiconductor device 200 according to another embodiment. The semiconductor device 200 is, for example, an Integrated Fan-Out (InFO) device. The semiconductor device 200 includes a first semiconductor module 210, a second semiconductor module 220, an interconnection module 230, a redistribution layer (RDL) module 240, a molding material 250 and an under-fill material 260. The first semiconductor module 210 could be a memory, such as Dynamic Random Access Memory (DRAM), High Bandwidth Memory (HBM), or a chip, such as a System-on-Chip (SOC) device. The second semiconductor module 220 could be a chip, such as a SOC device, or a memory, such as DRAM, HBM. The interconnection module 230 is, for example, composed of a plurality of conductive pillars 232 and an insulating material 233. The interconnection module 230 is also called TIV (Through InFO Via) die. The RDL module 240 is, for example, composed of a plurality of metal traces and a polymer. The RDL module 240 is used to fan out the circuit paths.

As shown in FIG. 3, the first semiconductor module 210 is disposed on the RDL module 240. The interconnection module 230 is disposed on the RDL module 240. The second semiconductor module 220 is disposed on the interconnection module 230. The molding material 250 covers the RDL module 240 and surrounds the first semiconductor module 210, the second semiconductor module 220 and the interconnection module 230. A top surface 210s of the first semiconductor module 210 and a top surface 220s of the second semiconductor module 220 are exposed by the molding material 250.

Due to the interconnection module 230, the second semiconductor module 220 is elevated, so that the top surface 210s and the top surface 220s are substantially located at the same plane and can be exposed by the molding material 250. As such, the heat generated from the first semiconductor module 210 and the second semiconductor module 220 can be effectively dissipated via the top surface 210s and the top surface 220s.

As shown in FIG. 3, the first semiconductor module 210 is bonded with the RDL module 240 through a plurality of copper bumps 211; the second semiconductor module 220 is jointed with the interconnection module 230 through a plurality of solder balls 221; the interconnection module 230 is bonded with the RDL module 240 through a plurality of copper bumps 231. Because only the connection between the second semiconductor module 220 is solder joint, so the under-fill material 260 could be used to only cover the solder balls 221 connected between the second semiconductor module 220 and the interconnection module 230. As shown in FIG. 3, an area A220 of the under-fill material 260 contacting the second semiconductor module 220 is larger than an area A230 of the under-fill material 260 contacting the interconnection module 230.

The interconnection module 230 has the conductive pillars 232. A diameter D221 of each of the solder balls 221 connected between the second semiconductor module 220 and the interconnection module 230 is larger than a diameter D232 of each of the conductive pillars 232 of the interconnection module 230. Therefore, the solder balls 221 could be firmly jointed with the conductive pillars 232.

Further, the molding material 250 covers the under-fill material 260, part of the first semiconductor module 210, part of the second semiconductor module 220 and part of the interconnection module 230.

Figure 4A:
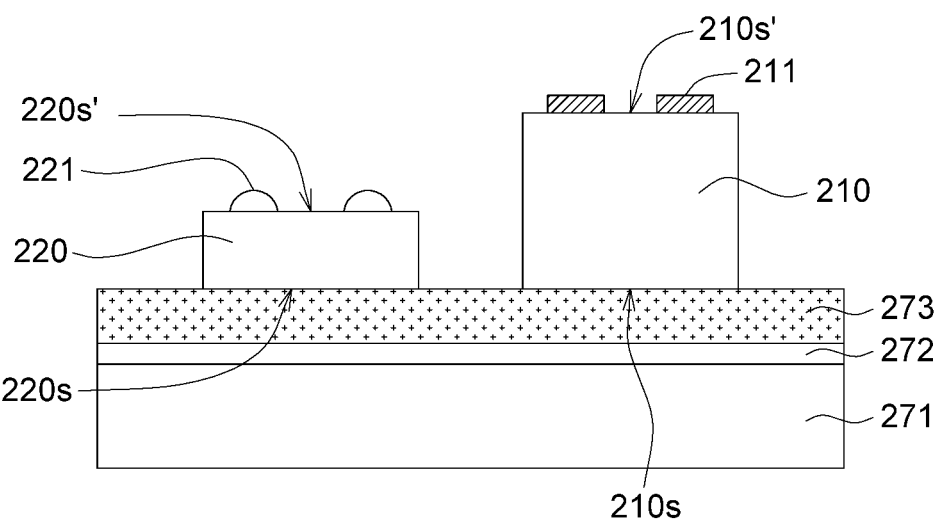
FIGS. 4A to 4H illustrate a manufacturing method of the semiconductor device according to one embodiment.

Please refer to FIGS. 4A to 4H, which illustrate a manufacturing method of the semiconductor device 200 according to one embodiment. As shown in FIG. 4A, a removable adhesive film 272 and a die attach film (DAF) 273 are disposed on a carrier 271. The first semiconductor module 210 and the second semiconductor module 220 are picked and placed on the die attach film 273. The top surface 210s of the first semiconductor module 210 and the top surface 220s of the second semiconductor module 220 face down and contact the die attach film 273. A bottom surface 210s' of the first semiconductor module 210 and a bottom surface 220s' of the second semiconductor module 220 face up. After placing the first semiconductor module 210 and the second semiconductor module 220, the die attach film 273 is cured.

Figure 4B:
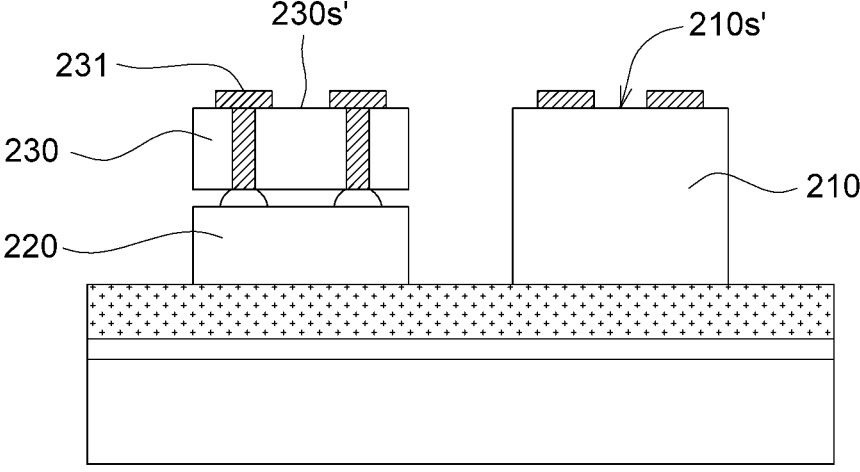

Then, as shown in FIG. 4B, the interconnection module 230 is jointed with the second semiconductor module 220. The copper bumps 231 of the interconnection module 230 face up. A bottom surface 230s' of the interconnection module 230 and the bottom surface 210s' of the first semiconductor module 210 are substantially located at the same plane.

Figure 4C:
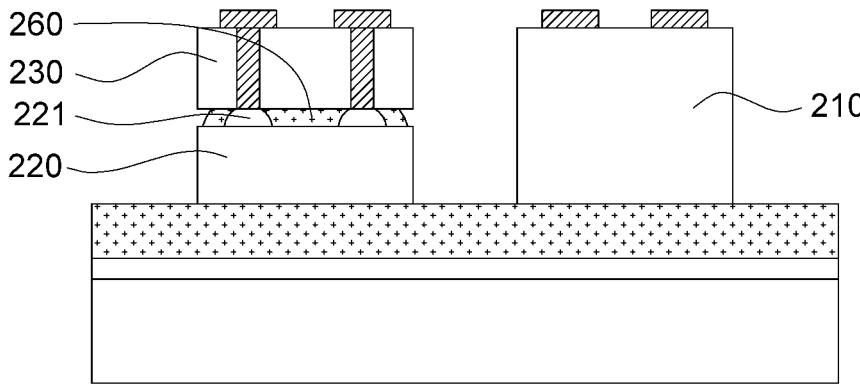

Next, as shown in FIG. 4C, the under-fill material 260 is filled to cover the solder balls 221 of the second semiconductor module 220.

Figure 4D:
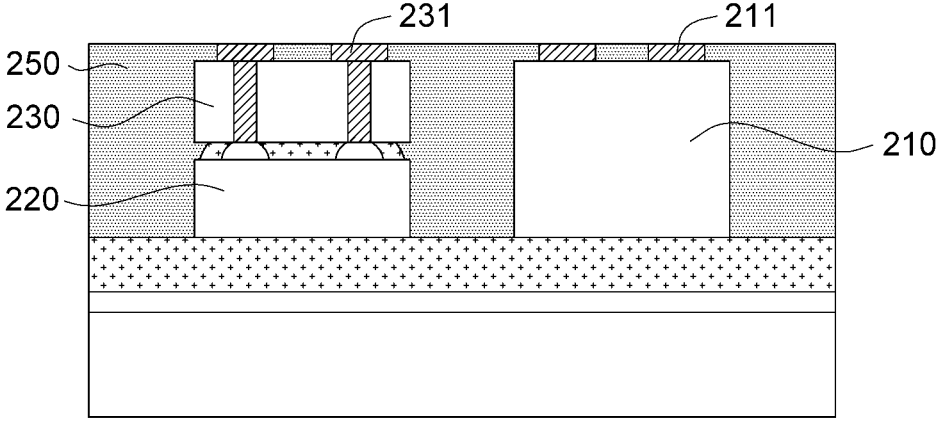

Then, as shown in FIG. 4D, the molding material 250 covers the first semiconductor module 210, the second semiconductor module 220 and the interconnection module 230. The molding material 250 is grinded to expose the copper bumps 231 and the copper bumps 211.

Figure 4E:
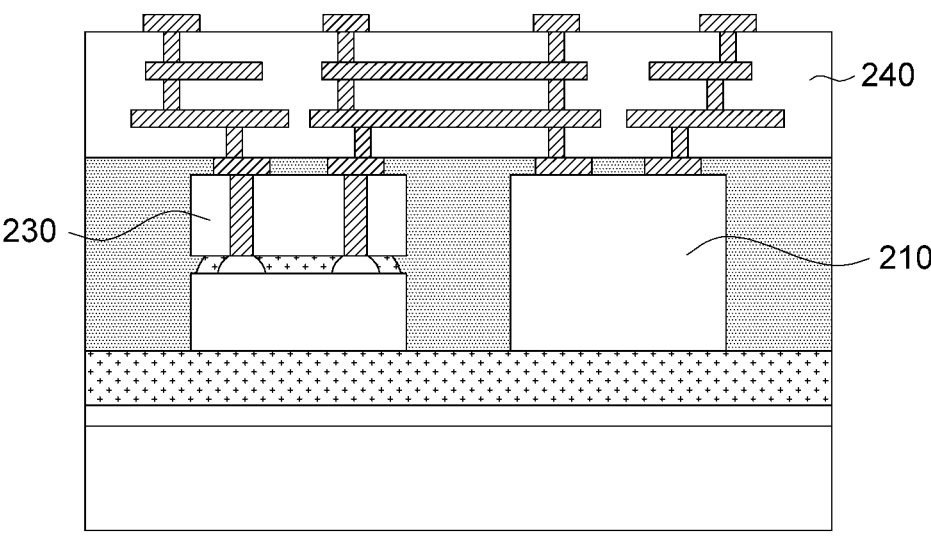

Afterwards, as shown in FIG. 4E, the RDL module 240 is formed on the interconnection module 230 and the first semiconductor module 210. In this step, the polymer layers and metal traces are formed layer by layer. At the top of the RDL module 240, a plurality of under bump metals (UBM) are formed.

Figure 4F:
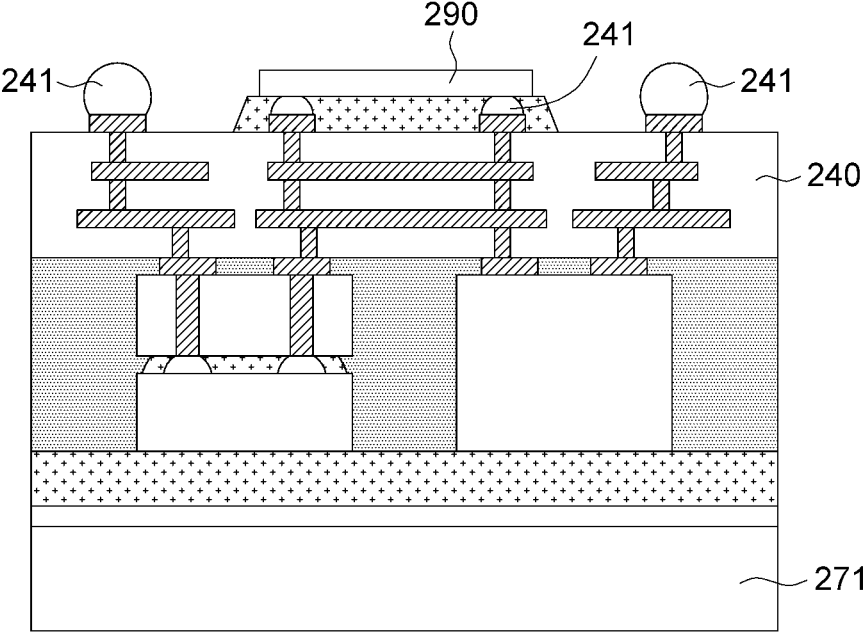

Next, as shown in FIG. 4F, a plurality of solder balls 241 are formed on the UBMs and another chip 290 is jointed with the RDL module 240.

Figure 4G:
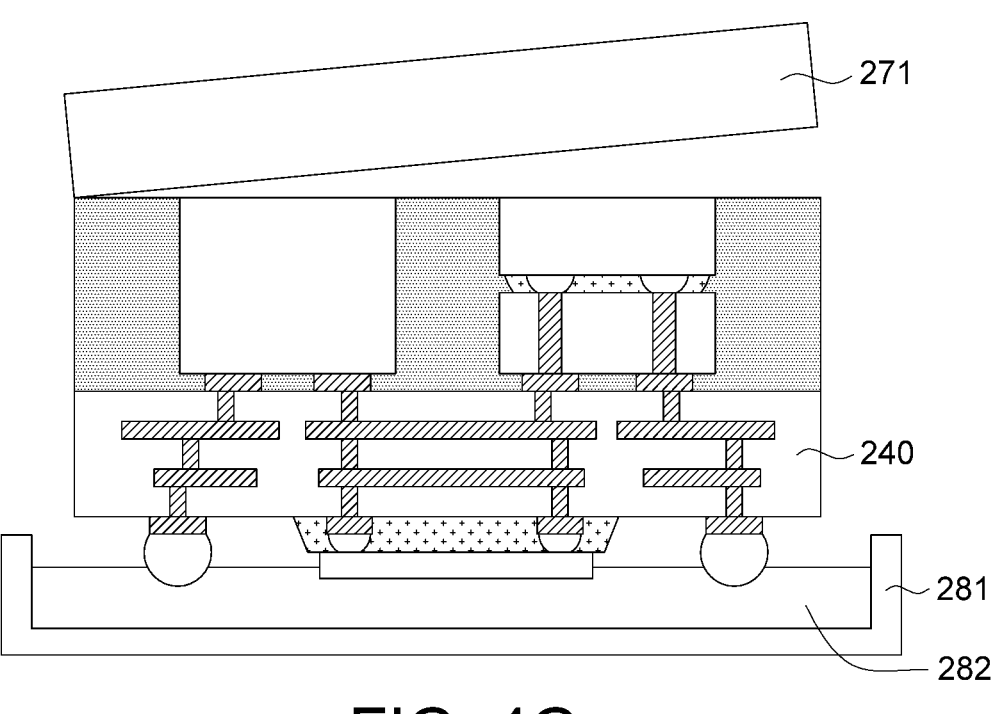

Afterwards, as shown in FIG. 4G, the carrier 271 is flipped and the RDL module 240 is placed on a dicing frame 281 with a dicing tape 282.

Figure 4H:
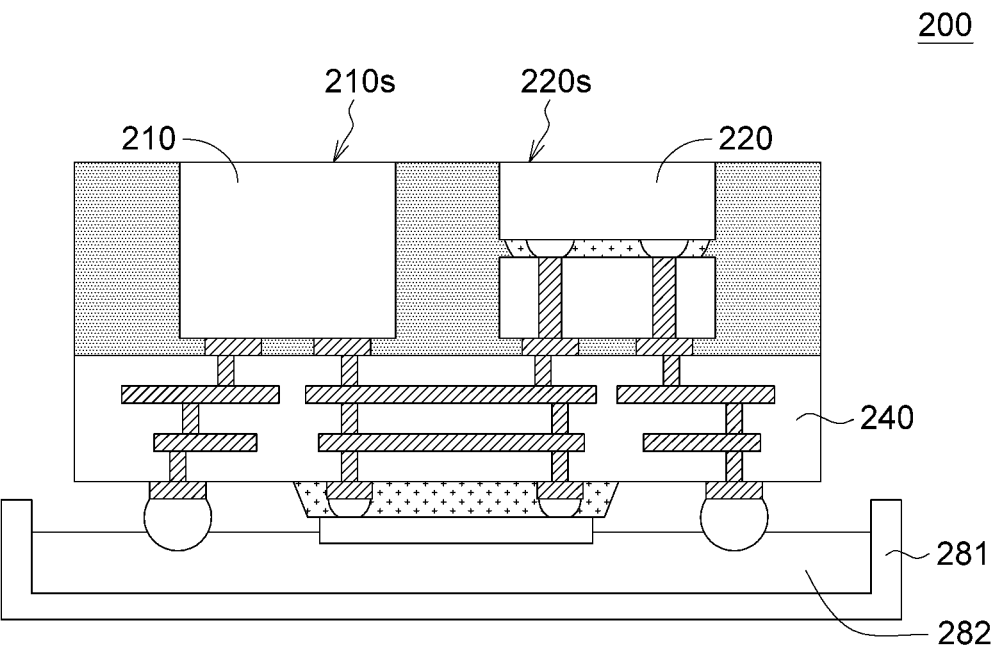

Then, as shown in FIG. 4H, the carrier 271 (shown in FIG. 4G) is removed. After the carrier 271 is removed, the top surface 210s of the first semiconductor module 210 and the top surface 220s of the second semiconductor module 220s are exposed.

Based on above, the semiconductor device 200 having more than one semiconductor modules is formed. In the manufacturing method of the semiconductor device 200, the first semiconductor module 210 and the second semiconductor module 220 are formed before forming the RDL module 240, so that the RDL module 240 can be directly formed on the first semiconductor module 210 having the copper bumps 211 and the interconnection module 230 having the copper bumps 231 without solder joint.

Further, only one carrier 271 is needed. Compared with the traditional process with two carriers, the process complexity is reduced, and the quality is easy to be controlled and the cost could be lower.

Because the top surface 210s of the first semiconductor module 210 and the top surface 220s of the second semiconductor module 220 contact the die attach film 273 at the step shown in FIG. 4A, so the top surface 210s of the first semiconductor module 210 and the top surface 220s of the second semiconductor module 220 can be exposed after removing the carrier 271.

Moreover, the under-fill material 260 is filled before flipping the semiconductor device 200, so the under-fill material 260 is upside down.

Figure 5:
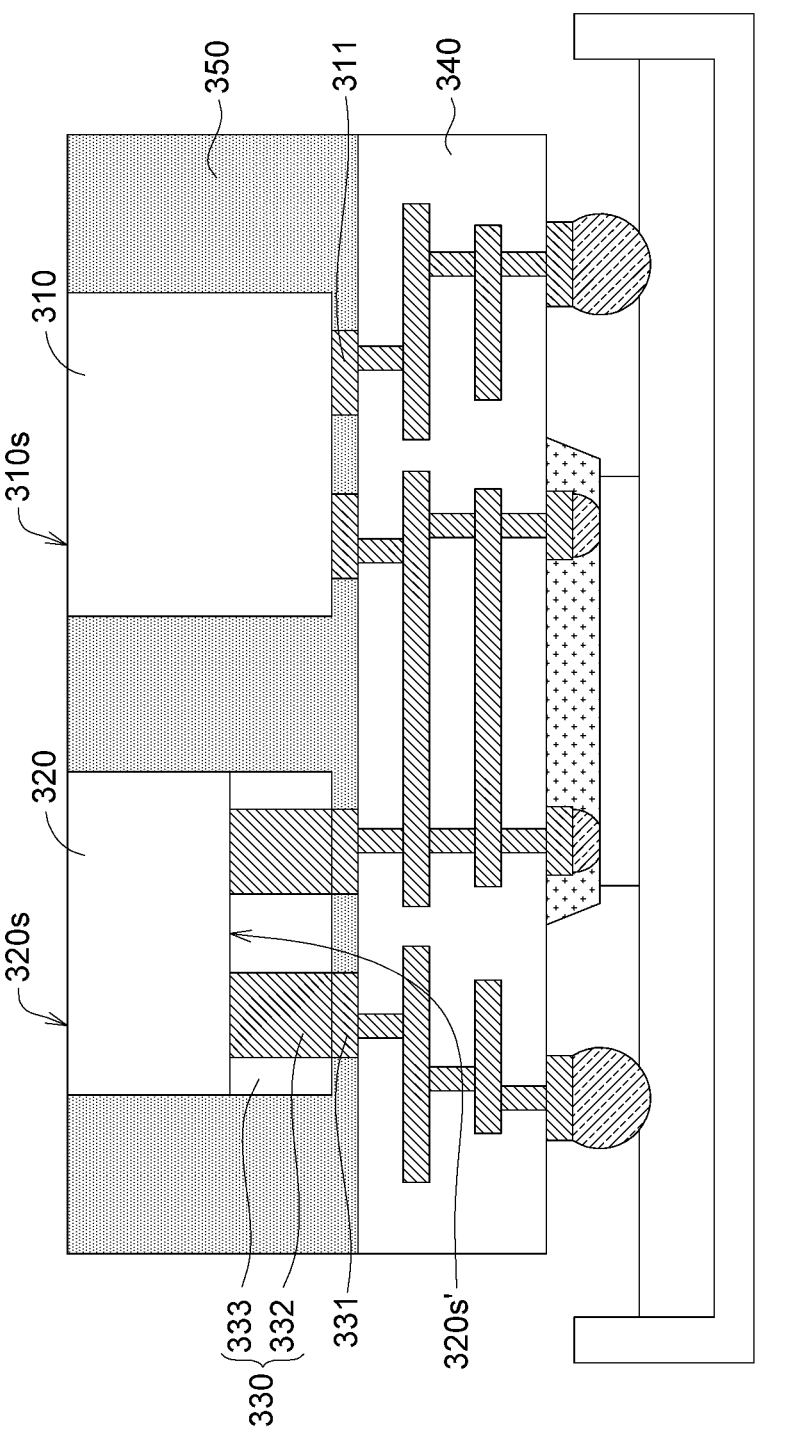
FIG. 5 shows another semiconductor device according to another embodiment.

Please refer to FIG. 5, which shows another semiconductor device 300 according to another embodiment. The semiconductor device 300 is, for example, an Integrated Fan-Out (InFO) device. The semiconductor device 300 includes a first semiconductor module 310, a second semiconductor module 320, an interconnection module 330, a redistribution layer (RDL) module 340 and a molding material 350. The first semiconductor module 310 could be a memory, such as Dynamic Random Access Memory (DRAM), High Bandwidth Memory (HBM), or a chip, such as a System-on-Chip (SOC) device. The second semiconductor module 320 could be a chip, such as a SOC device, or a memory, such as DRAM, HBM. The interconnection module 330 is, for example, composed of a plurality of conductive pillars 332 and an insulating material 333. The interconnection module 330 is also called TIV (Through InFO Via) die. The RDL module 340 is, for example, composed of a plurality of metal traces and a polymer. The RDL module 340 is used to fan out the circuit paths.

As shown in FIG. 5, the first semiconductor module 310 is disposed on the RDL module 340. The interconnection module 330 is disposed on the RDL module 340. The second semiconductor module 320 is disposed on the interconnection module 330. The molding material 350 covers the RDL module 340 and surrounds the first semiconductor module 310, the second semiconductor module 320 and the interconnection module 330. A top surface 310s of the first semiconductor module 310 and a top surface 320s of the second semiconductor module 320 are exposed by the molding material 350.

Due to the interconnection module 330, the second semiconductor module 320 is elevated, so that the top surface 310s and the top surface 320s are substantially located at the same plane and can be exposed by the molding material 350. As such, the heat generated from the first semiconductor module 310 and the second semiconductor module 320 can be effectively dissipated via the top surface 310s and the top surface 320s.

As shown in FIG. 5, the first semiconductor module 310 is bonded with the RDL module 340 through a plurality of copper bumps 311; the interconnection module 330 is directly formed at a bottom surface 320s' of the second semiconductor module 320; the interconnection module 330 is bonded with the RDL module 340 through a plurality of copper bumps 331. Because none of the connection among the first semiconductor module 310, the second semiconductor module 320, the interconnection module 330 and the RDL module 340 is solder joint, so any under-fill material is not used in the semiconductor device 300.

Figure 6A:
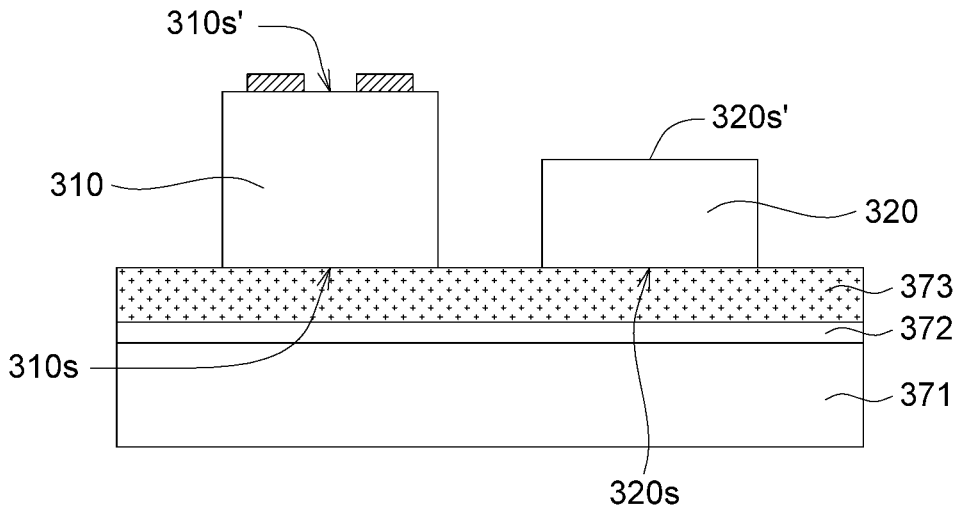
FIGS. 6A to 6L illustrate a manufacturing method of the semiconductor device according to one embodiment.

Please refer to FIGS. 6A to 6L, which illustrate a manufacturing method of the semiconductor device 300 according to one embodiment. As shown in FIG. 6A, a removable adhesive film 372 and a die attach film (DAF) 373 are disposed on a carrier 371. The first semiconductor module 310 and the second semiconductor module 320 are picked and placed on the die attach film 373. The top surface 310s of the first semiconductor module 310 and the top surface 320s of the second semiconductor module 320 face down and contact the die attach film 373. A bottom surface 310s' of the first semiconductor module 310 and a bottom surface 320s' of the second semiconductor module 320 face up. After placing the first semiconductor module 310 and the second semiconductor module 320, the die attach film 373 is cured.

Figure 6B:
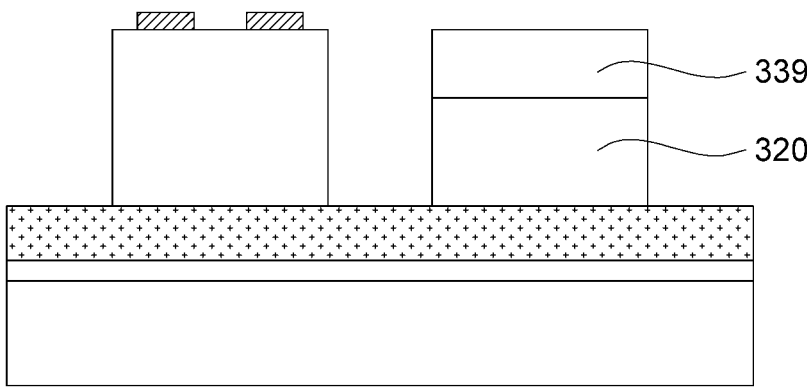

Next, as shown in FIG. 6B, a seed layer 339 is form on the second semiconductor module 320. The seed layer 339 is made of conductive material.

Figure 6C:
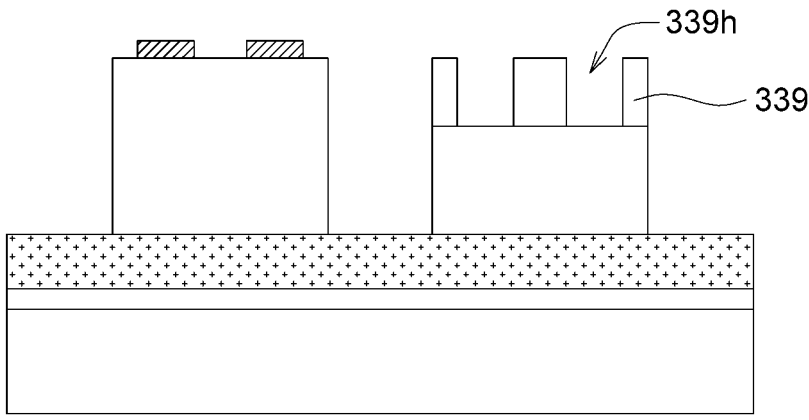

Then, as shown in FIG. 6C, the seed layer 339 is etched to form a plurality of openings 339h.

Figure 6D:
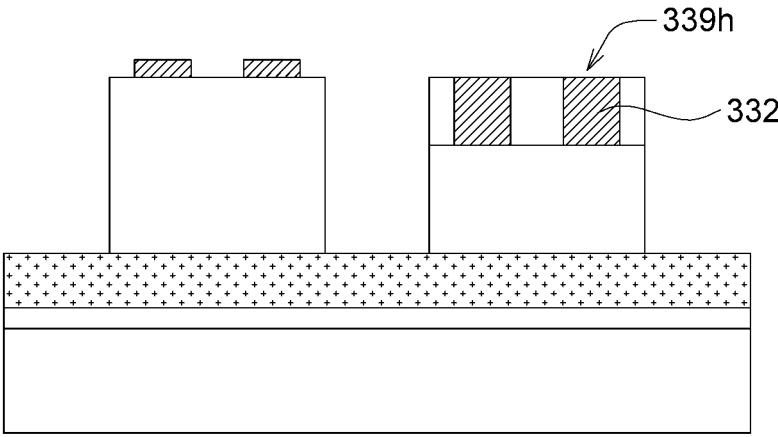

Next, as shown in FIG. 6D, metal is filled in the openings 339h by plating, and the conductive pillars 332 are formed.

Figure 6E:
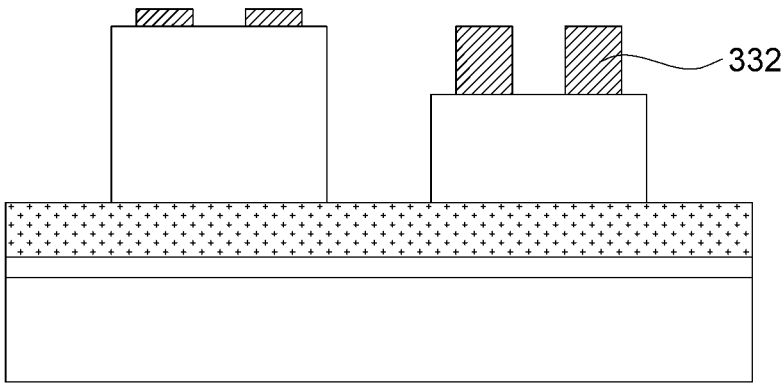

Then, as shown in FIG. 6E, the seed layer 339 (shown in FIG. 6D) is removed by etching and the conductive pillars 332 are remained.

Figure 6F:
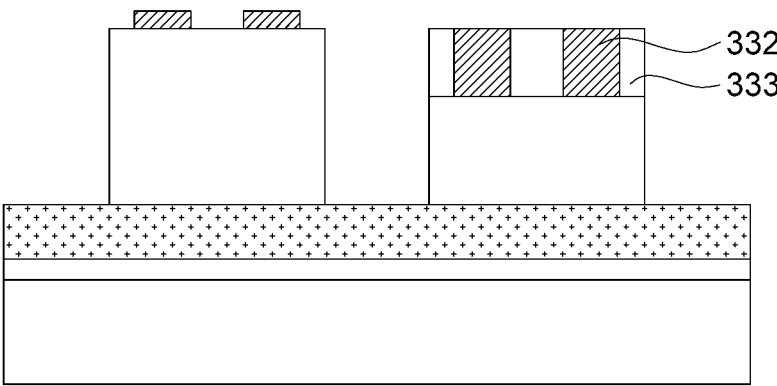

Afterwards, as shown in FIG. 6F, the insulating material 333, such as a molding material, is formed to support the conductive pillars 332. Some of the insulating material 333 may cover the top of the conductive pillars 332 and a grinding process, such as MCG or CMP, may be used to expose the top of the conductive pillars 332.

Figure 6G:
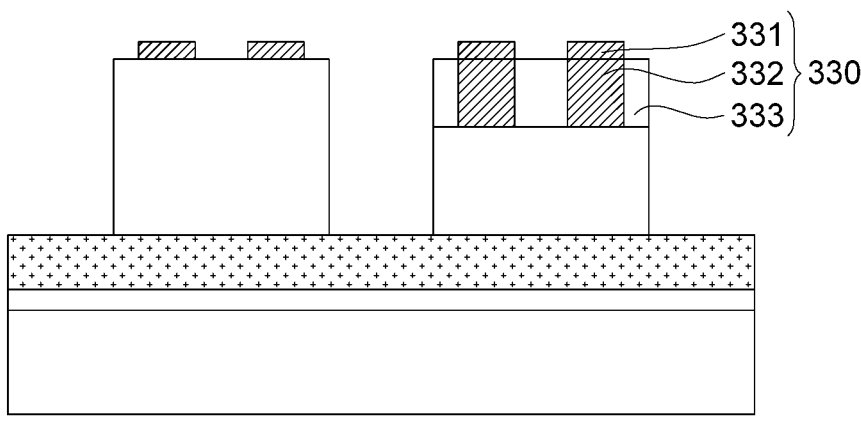

Next, as shown in FIG. 6G, a plurality of copper bumps 331, are formed on the insulating material 333 and the conductive pillars 332. The conductive pillars 332, the insulating material 333 and the copper bumps 331 form the interconnection module 330.

Figure 6H:
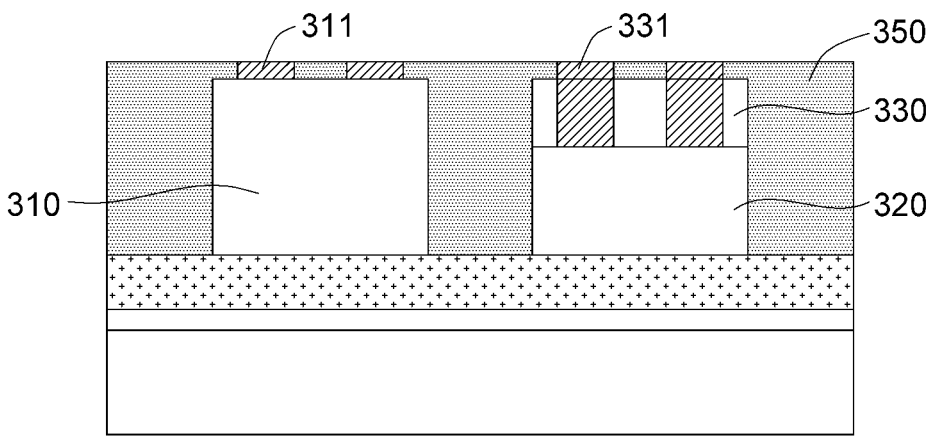

Then, as shown in FIG. 6H, the molding material 350 covers the first semiconductor module 310, the second semiconductor module 320 and the interconnection module 330. The molding material 350 is grinded to expose the copper bumps 331 and the copper bumps 311.

Figure 6I:
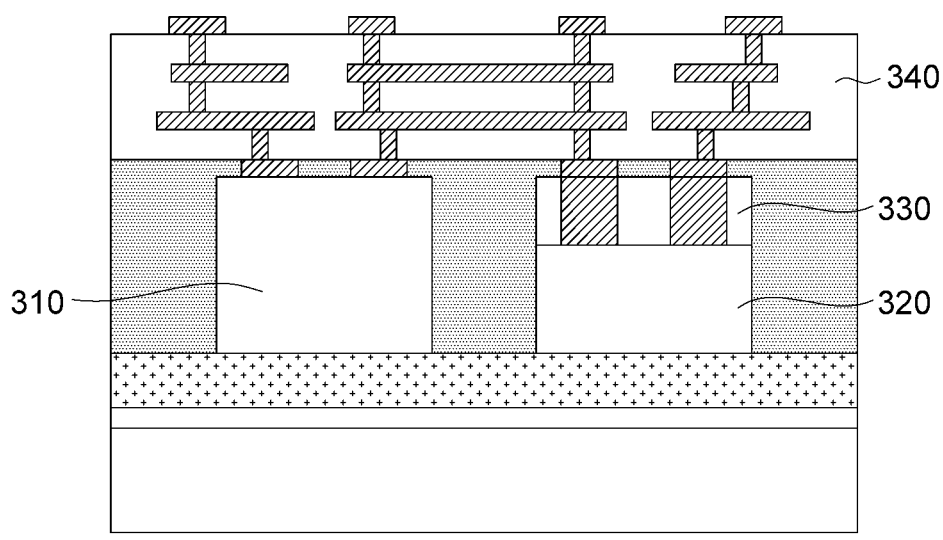

Afterwards, as shown in FIG. 6I, the RDL module 340 is formed on the interconnection module 330 and the first semiconductor module 310. In this step, the polymer layers and metal traces are formed layer by layer. At the top of the RDL module 340, a plurality of under bump metals (UBM) are formed.

Figure 6J:
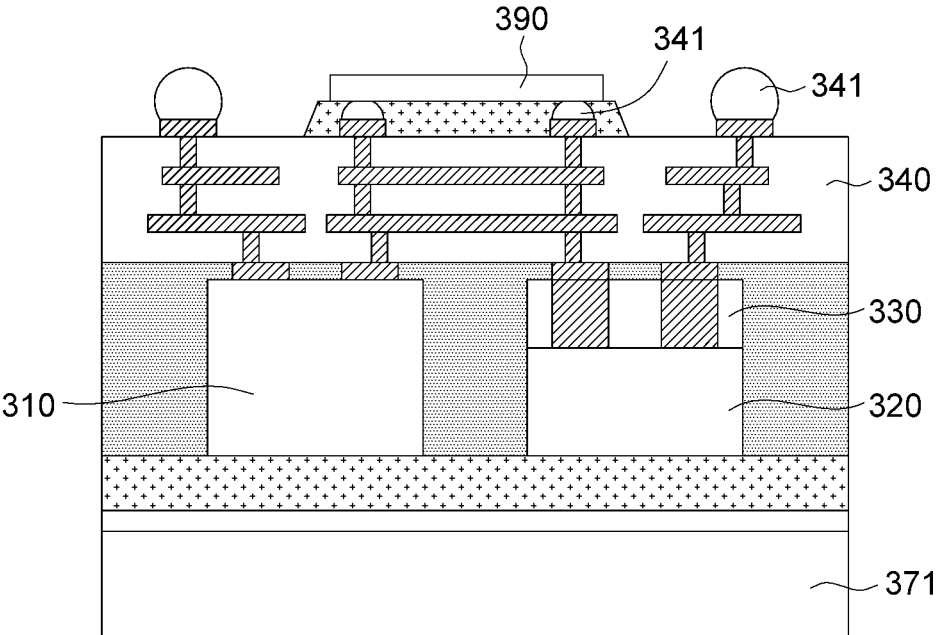

Next, as shown in FIG. 6J, a plurality of solder balls 341 are formed on the UBMs and another chip 390 is jointed with the RDL module 340.

Figure 6K:
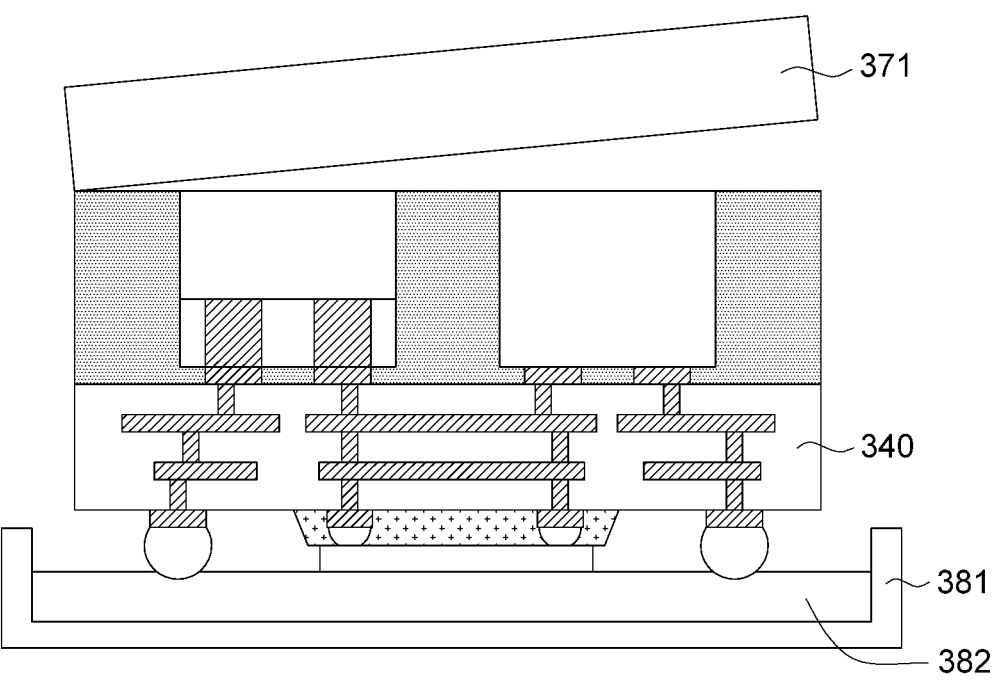

Afterwards, as shown in FIG. 6K, the carrier 371 is flipped and the RDL module 340 is placed on a dicing frame 381 with a dicing tape 382.

Figure 6L:
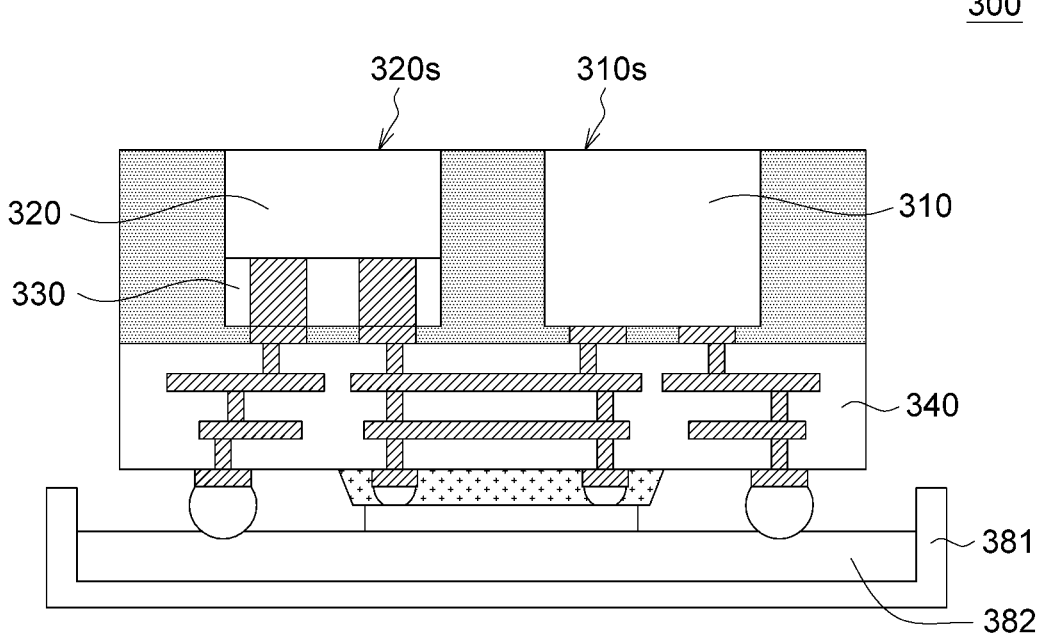

Then, as shown in FIG. 6L, the carrier 371 (shown in FIG. 6K) is removed. After the carrier 371 is removed, the top surface 310s of the first semiconductor module 310 and the top surface 320s of the second semiconductor module 320s are exposed.

Based on above, the semiconductor device 300 having more than one semiconductor modules is formed. In the manufacturing method of the semiconductor device 300, the first semiconductor module 310 and the second semiconductor module 320 are formed before forming the RDL module 340, so that the RDL module 340 can be directly formed on the first semiconductor module 310 having the copper bumps 311 and the interconnection module 330 having the copper bumps 331 without solder joint.

Further, only one carrier 371 is needed. Compared with the traditional process with two carriers, the process complexity is reduced, and the quality is easy to be controlled and the cost could be lower.

Because the top surface 310s of the first semiconductor module 310 and the top surface 320s of the second semiconductor module 320 contact the die attach film 373 at the step shown in FIG. 6A, so the top surface 310s of the first semiconductor module 310 and the top surface 320s of the second semiconductor module 320 can be exposed after removing the carrier 371.

Figure 7:
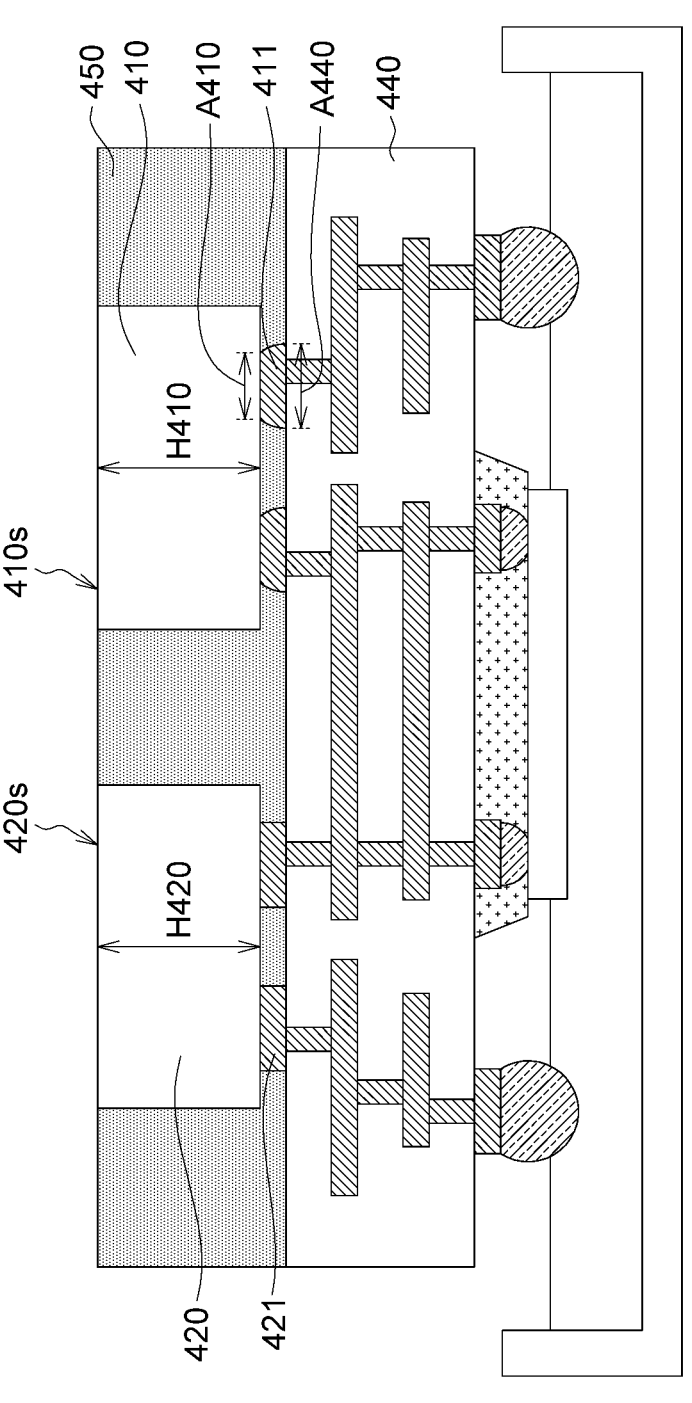
FIG. 7 shows another semiconductor device according to another embodiment.

Please refer to FIG. 7, which shows another semiconductor device 400 according to another embodiment. The semiconductor device 400 is, for example, an Integrated Fan-Out (InFO) device. The semiconductor device 400 includes a first semiconductor module 410, a second semiconductor module 420, a redistribution layer (RDL) module 440 and a molding material 450. The first semiconductor module 410 could be a memory, such as Dynamic Random Access Memory (DRAM), High Bandwidth Memory (HBM), or a chip, such as a System-on-Chip (SOC) device. The second semiconductor module 420 could be a chip, such as a SOC device, or a memory, such as DRAM, HBM. The RDL module 440 is, for example, composed of a plurality of metal traces and a polymer. The RDL module 440 is used to fan out the circuit paths.

As shown in FIG. 7, the first semiconductor module 410 is disposed on the RDL module 440. The second semiconductor module 420 is disposed on the RDL module 440. The molding material 450 covers the RDL module 440 and surrounds the first semiconductor module 410 and the second semiconductor module 420. A top surface 410s of the first semiconductor module 410 and a top surface 420s of the second semiconductor module 420 are exposed by the molding material 450.

In the present embodiment, one of the first semiconductor module 410 and the second semiconductor module 420 is grinded, such that a thickness H410 of the first semiconductor module 410 is substantially identical to a thickness H420 of the second semiconductor module 420. Therefore, the top surface 410s and the top surface 420s are substantially located at the same plane and can be exposed by the molding material 450. As such, the heat generated from the first semiconductor module 410 and the second semiconductor module 420 can be effectively dissipated via the top surface 410s and the top surface 420s.

As shown in FIG. 7, the first semiconductor module 410 is bonded with the RDL module 440 through a plurality of copper bumps 411; the second semiconductor module 420 is bonded with the RDL module 440 through a plurality of copper bumps 421. A shape of each of the copper bumps 411 connected between the first semiconductor module 410 and the RDL module 440 is different from a shape of each of the copper bumps 421 connected between the second semiconductor module 420 and the RDL module 440. For example, each of the copper bumps 411 connected between the first semiconductor module 410 and the RDL module 440 is partially spherical shaped. In particular, an area A410 of each of the copper bumps 411 contacting the first semiconductor module 410 is smaller than an area A440 of each of the copper bumps 411 contacting the RDL module 440.

Because none of the connection among the first semiconductor module 410, the second semiconductor module 420 and the RDL module 440 is solder joint, so any under-fill material is not used in the semiconductor device 400.

Figure 8A:
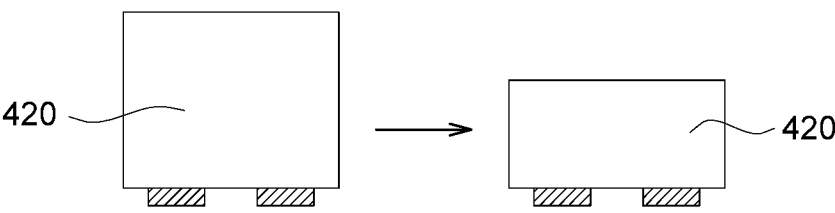
FIGS. 8A to 8H illustrate a manufacturing method of the semiconductor device according to one embodiment.

Please refer to FIGS. 8A to 8H, which illustrate a manufacturing method of the semiconductor device 400 according to one embodiment. As shown in FIG. 8A, the second semiconductor module 420, which is, for example, a SOC device, is grinded to be thinner. In another embodiment, the first semiconductor module 410 (shown in FIG. 8B) could be grinded to be thinner, if the first semiconductor module 410 is a SOC device.

Figure 8B:
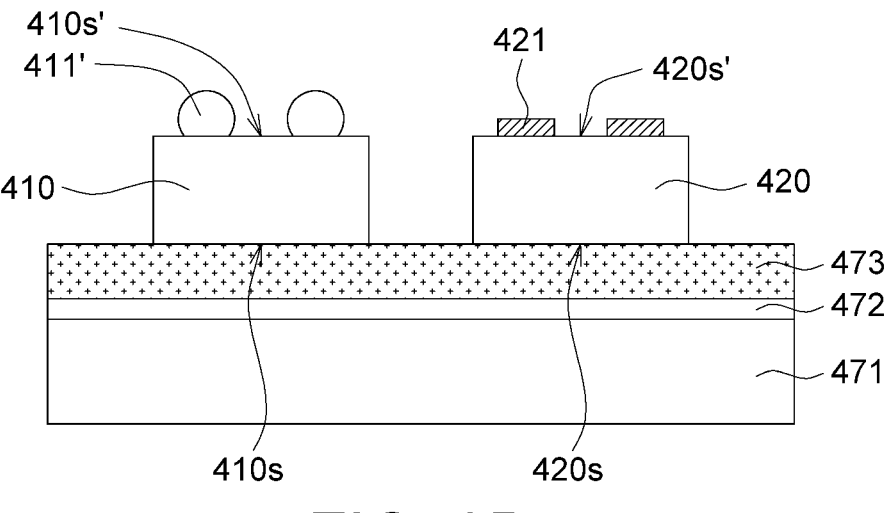

Then, as shown in FIG. 8B, a removable adhesive film 472 and a die attach film (DAF) 473 are disposed on a carrier 471. The first semiconductor module 410 and the second semiconductor module 420 are picked and placed on the die attach film 473. The top surface 410s of the first semiconductor module 410 and the top surface 420s of the second semiconductor module 420 face down and contact the die attach film 473. A bottom surface 410s' of the first semiconductor module 410 and a bottom surface 420s' of the second semiconductor module 420 face up. A plurality of solder balls 411' are already formed on the bottom surface 410s' of the first semiconductor module 410, and a plurality of copper bumps 421 are already formed on the bottom surface 420s' of the second semiconductor module 420. After placing the first semiconductor module 410 and the second semiconductor module 420, the die attach film 473 is cured.

Figure 8C:
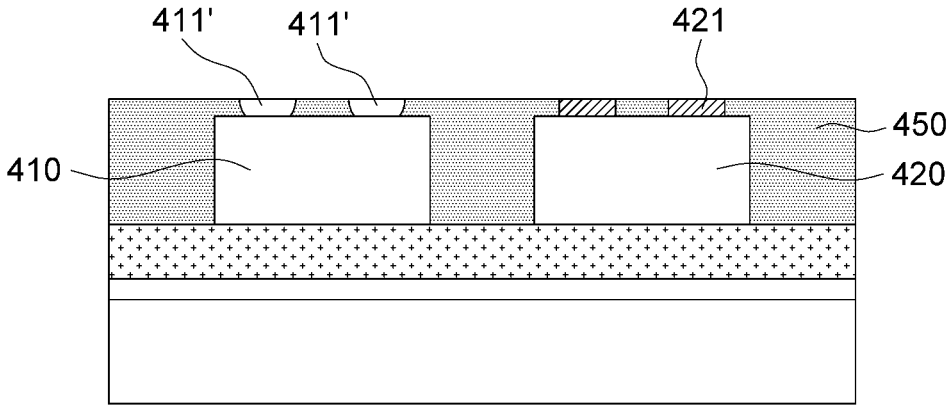

Next, as shown in FIG. 8C, the molding material 450 covers the first semiconductor module 410 and the second semiconductor module 420. The molding material 450 is grinded to expose the solder balls 411' and the copper bumps 421. Each of the solder balls 411' is grinded, so each of the solder balls 411' becomes partially spherical shaped.

Figure 8D:
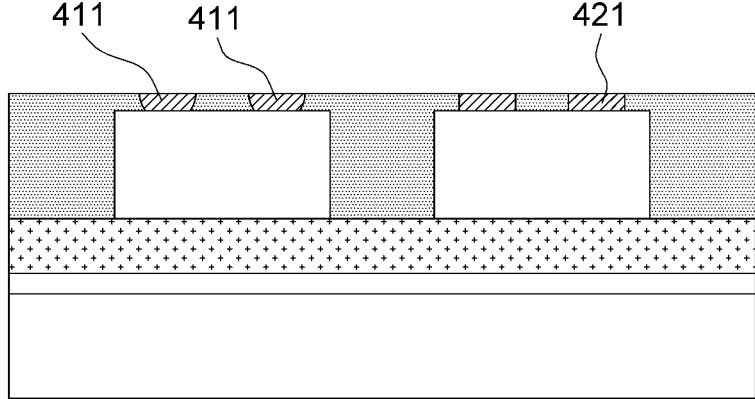

Then, as shown in FIG. 8D, the solder balls 411' (shown in FIG. 8C) are removed and copper are plated in the remained caves to form the copper bumps 411. Each of the copper bumps 411 is partially spherical shaped. The copper bumps 411 and the copper bumps 421 are made of copper, but they have different shapes.

Figure 8E:
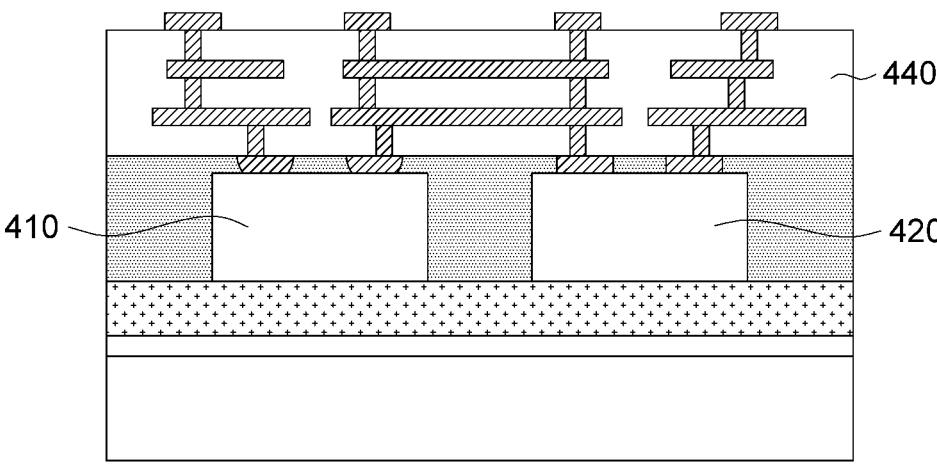

Afterwards, as shown in FIG. 8E, the RDL module 440 is formed on the first semiconductor module 410 and the second semiconductor module 420. In this step, the polymer layers and metal traces are formed layer by layer. At the top of the RDL module 440, a plurality of under bump metals (UBM) are formed.

Figure 8F:
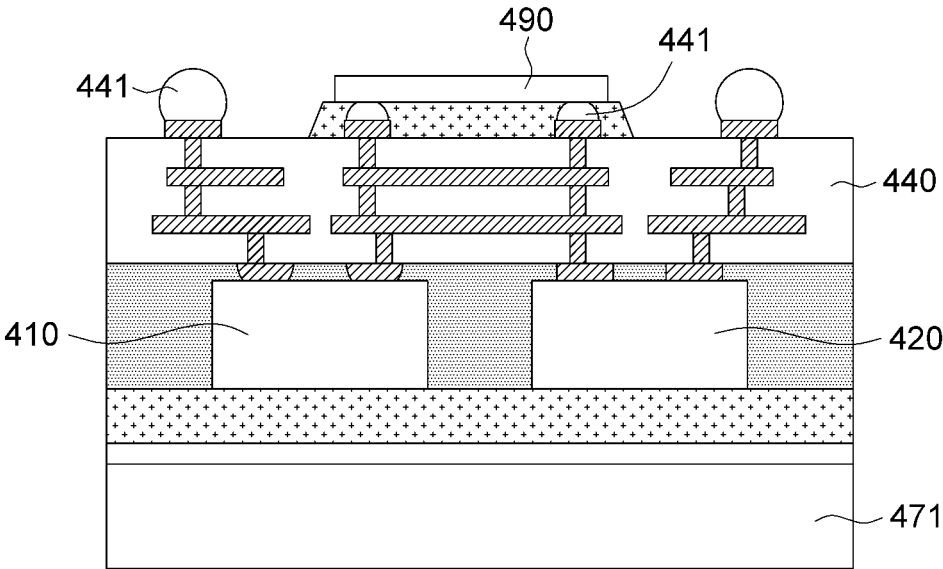

Next, as shown in FIG. 8F, a plurality of solder balls 441 are formed on the UBMs and another chip 490 is jointed with the RDL module 440.

Figure 8G:
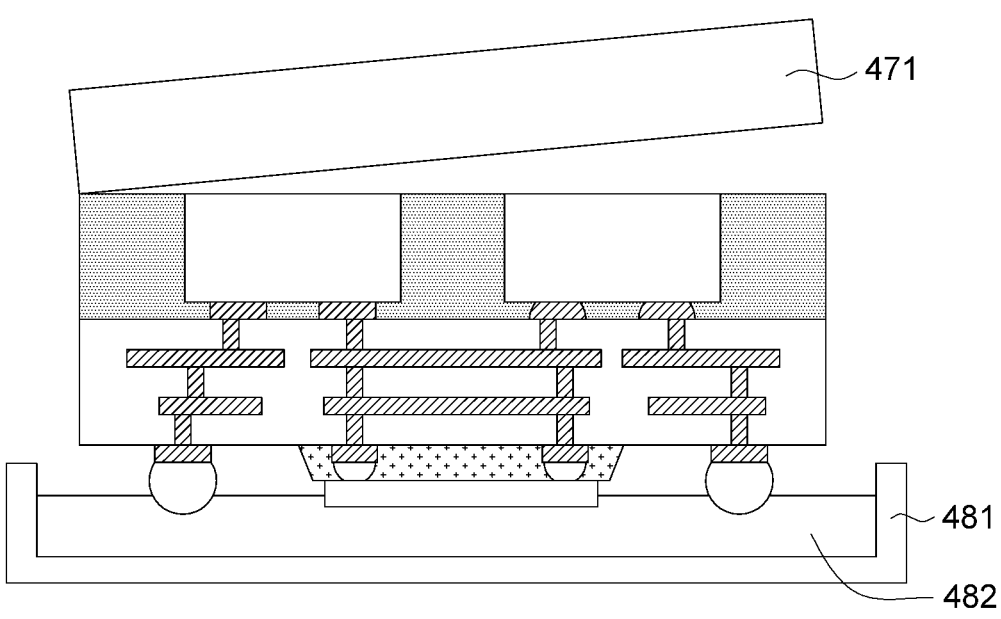

Afterwards, as shown in FIG. 8G, the carrier 471 is flipped and the RDL module 440 is placed on a dicing frame 481 with a dicing tape 482.

Figure 8H:
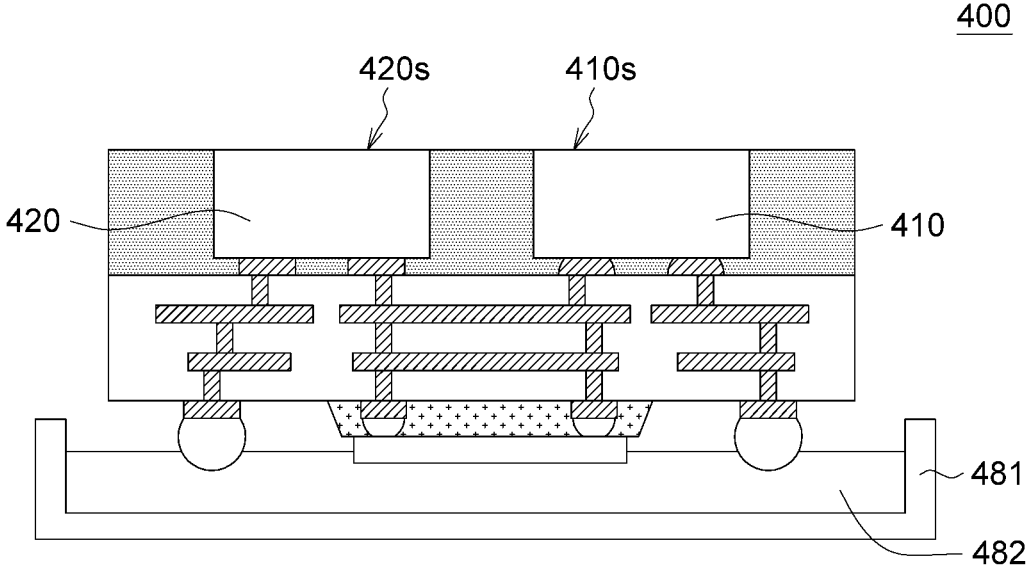

Then, as shown in FIG. 8H, the carrier 471 (shown in FIG. 8G) is removed. After the carrier 471 is removed, the top surface 410s of the first semiconductor module 410 and the top surface 420s of the second semiconductor module 420s are exposed.

Based on above, the semiconductor device 400 having more than one semiconductor modules is formed. In the manufacturing method of the semiconductor device 400, the first semiconductor module 410 and the second semiconductor module 420 are formed before forming the RDL module 440, so that the RDL module 440 can be directly formed on the first semiconductor module 410 having the copper bumps 411 and the second semiconductor module 420 having the copper bumps 421 without solder join.

Further, only one carrier 471 is needed. Compared with the traditional process with two carriers, the process complexity is reduced, and the quality is easy to be controlled and the cost could be lower.

Because the top surface 410s of the first semiconductor module 410 and the top surface 420s of the second semiconductor module 420 contact the die attach film 473 at the step shown in FIG. 8A, so the top surface 410s of the first semiconductor module 410 and the top surface 420s of the second semiconductor module 420 can be exposed after removing the carrier 471.

Figure 9:
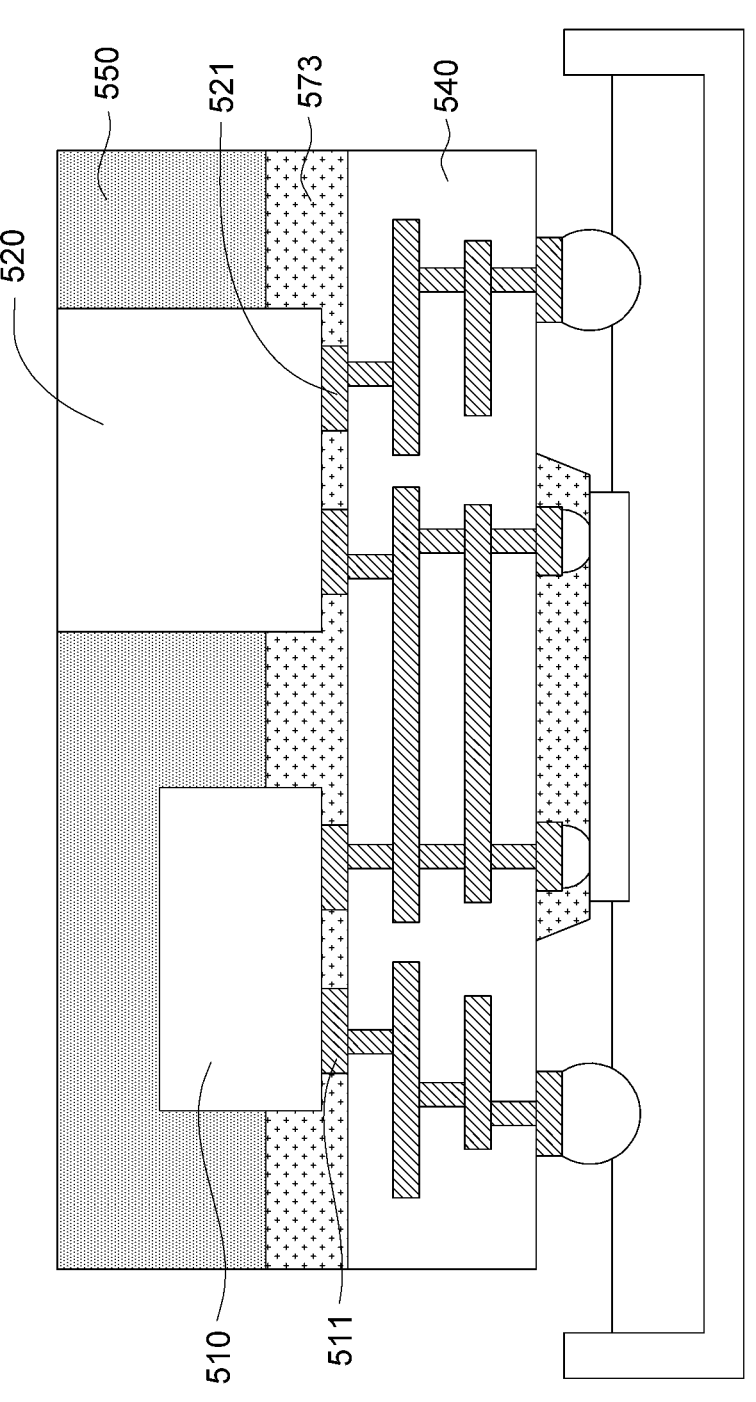
FIG. 9 shows another semiconductor device according to another embodiment.

Please refer to FIG. 9, which shows another semiconductor device 500 according to another embodiment. The semiconductor device 500 is, for example, an Integrated Fan-Out (InFO) device. The semiconductor device 500 includes a first semiconductor module 510, a second semiconductor module 520, a redistribution layer (RDL) module 540 and a molding material 550. The first semiconductor module 510 could be a memory, such as Dynamic Random Access Memory (DRAM), High Bandwidth Memory (HBM), or a chip, such as a System-on-Chip (SOC) device. The second semiconductor module 520 could be a chip, such as a SOC device, or a memory, such as DRAM, HBM. The RDL module 540 is, for example, composed of a plurality of metal traces and a polymer. The RDL module 540 is used to fan out the circuit paths.

As shown in FIG. 9, the first semiconductor module 510 is disposed on the RDL module 540. The second semiconductor module 520 is disposed on the RDL module 540. The molding material 550 covers the RDL module 540 and surrounds the first semiconductor module 510 and the second semiconductor module 520.

As shown in FIG. 9, the first semiconductor module 510 is bonded with the RDL module 540 through a plurality of copper bumps 511; the second semiconductor module 520 is bonded with the RDL module 540 through a plurality of copper bumps 521.

Because none of the connection among the first semiconductor module 510, the second semiconductor module 520 and the RDL module 540 is solder joint, so any under-fill material is not used in the semiconductor device 500.

Instead of the under-fill material, the lower portion of the first semiconductor module 510, the copper bumps 511, the lower portion of the second semiconductor module 520 and the copper bumps 521 are covered by a die attach film (DAF) 573, which is cured.

Figure 10A:
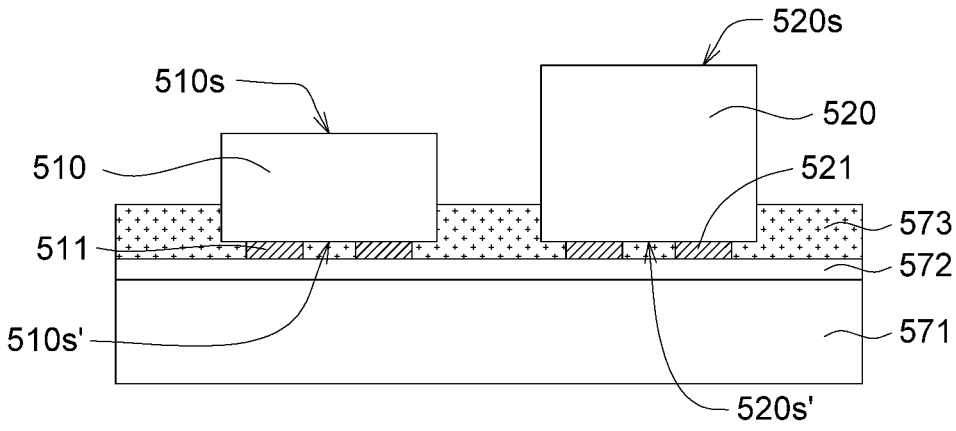
FIGS. 10A to 10G illustrate a manufacturing method of the semiconductor device according to one embodiment.

Please refer to FIGS. 10A to 10G, which illustrate a manufacturing method of the semiconductor device 500 according to one embodiment. As shown in FIG. 10A, a removable adhesive film 572 and the die attach film 573 are disposed on a carrier 571. The first semiconductor module 510 and the second semiconductor module 520 are picked and placed on the die attach film 573. The top surface 510s of the first semiconductor module 510 and the top surface 520s of the second semiconductor module 520 face up. A bottom surface 510s' of the first semiconductor module 510 and a bottom surface 520s' of the second semiconductor module 520 face down. The copper bumps 511 are already formed on the bottom surface 510s' of the first semiconductor module 510, and the copper bumps 521 are already formed on the bottom surface 520s' of the second semiconductor module 520. The copper bumps 511 and the copper bumps 521 are inserted into the die attach film 573. After placing the first semiconductor module 510 and the second semiconductor module 520, the die attach film 573 is cured, and the copper bumps 511 and the copper bumps 521 are embedded in the die attach film 573.

Figure 10B:
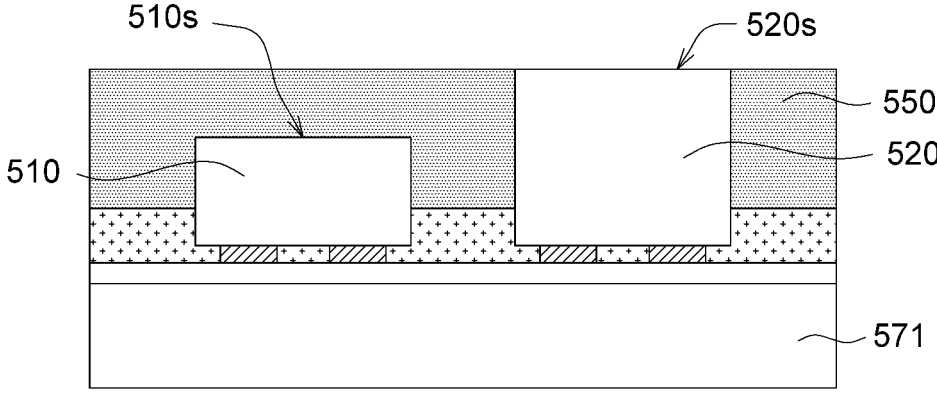

Next, as shown in FIG. 10B, the molding material 550 covers the first semiconductor module 510 and the second semiconductor module 520. The molding material 550 is grinded to at least expose the top surface 520s of the second semiconductor module 520. In another embodiment, the molding material 550 could be grinded to expose the top surface 520s of the second semiconductor module 520 and the top surface 510s of the first semiconductor module 510.

Figure 10C:
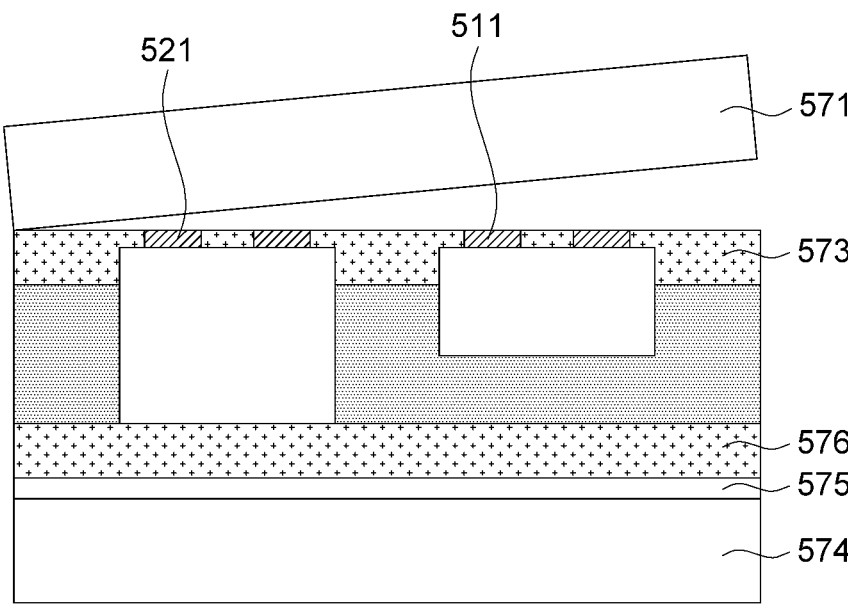

Then, as shown in FIG. 10C, a removable adhesive film 575 and a die attach film 576 are disposed on a carrier 574. The carrier 571 is flipped. After the first semiconductor module 510 and the second semiconductor module 520 which are molded are placed on the die attach film 576, the carrier 571 is removed. In this step, the die attach film 573 is grinded to expose the copper bumps 511 and the copper bumps 521, if the copper bumps 511 and the copper bumps 521 are not exposed.

Figure 10D:
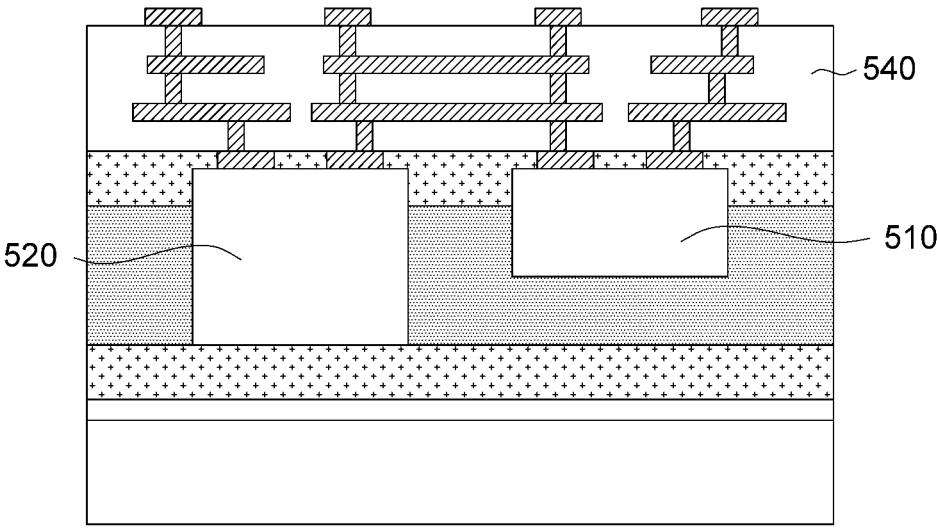

Afterwards, as shown in FIG. 10D, the RDL module 540 is formed on the first semiconductor module 510 and the second semiconductor module 520. In this step, the polymer layers and metal traces are formed layer by layer. At the top of the RDL module 540, a plurality of under bump metals (UBM) are formed.

Figure 10E:
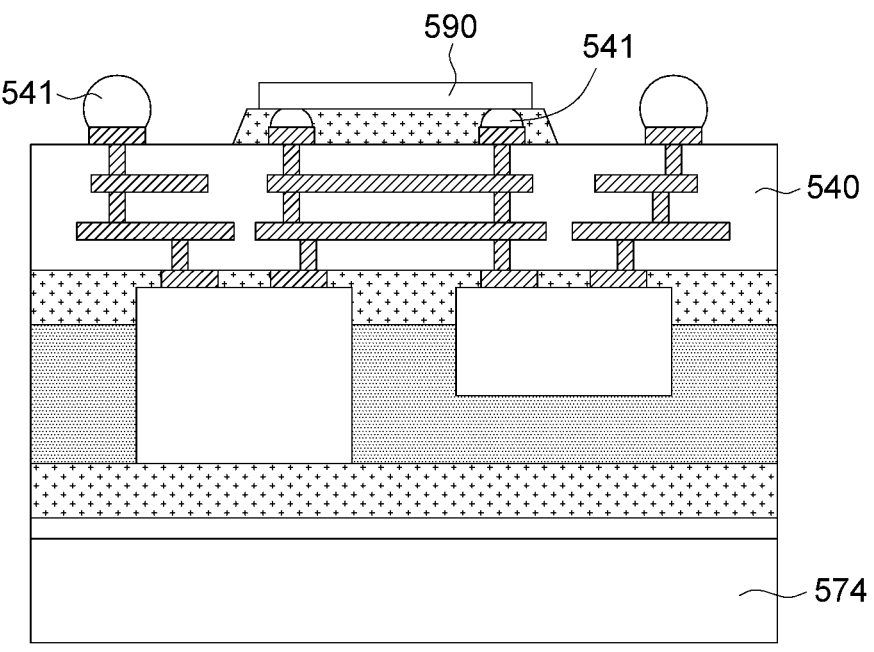

Next, as shown in FIG. 10E, a plurality of solder balls 541 are formed on the UBMs and another chip 590 is jointed with the RDL module 540.

Figure 10F:
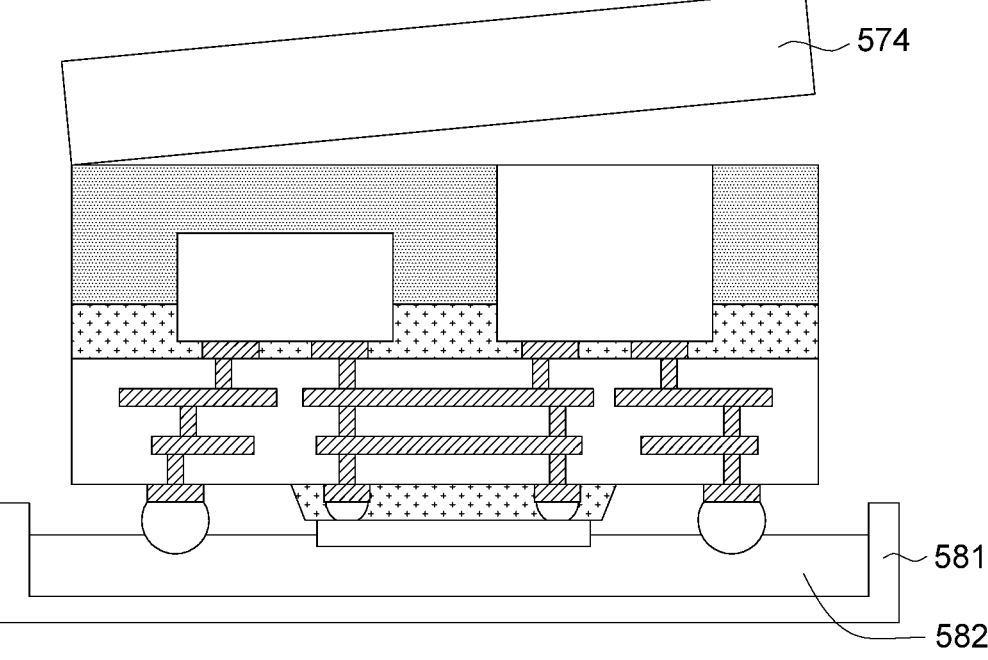

Afterwards, as shown in FIG. 10F, the carrier 574 is flipped and the RDL module 540 is placed on a dicing frame 581 with a dicing tape 582.

Figure 10G:
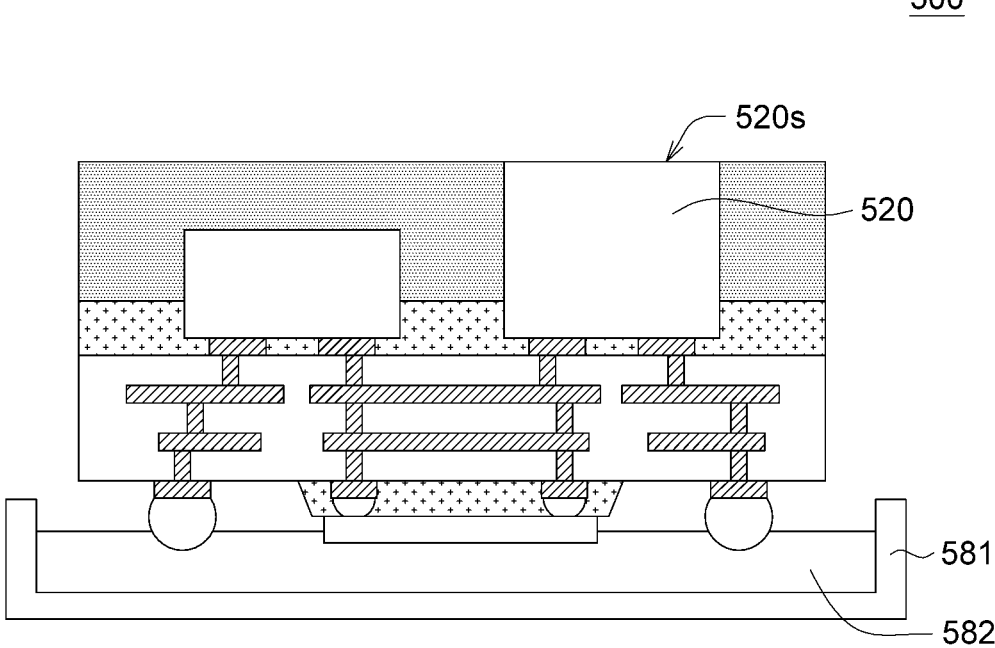

Then, as shown in FIG. 10G, the carrier 574 (shown in FIG. 10F) is removed. After the carrier 574 is removed, at least the top surface 520s of the second semiconductor module 520 is exposed.

Based on above, the semiconductor device 500 having more than one semiconductor modules is formed. In the manufacturing method of the semiconductor device 500, the first semiconductor module 510 and the second semiconductor module 520 are formed before forming the RDL module 540, so that the RDL module 540 can be directly formed on the first semiconductor module 510 having the copper bumps 511 and the second semiconductor module 520 having the copper bumps 521 without solder joint.

According to the embodiments described above, the semiconductor device having more than one semiconductor modules is formed. Due to the interconnection module, the second semiconductor module can be elevated, so that the top surface of the first semiconductor module and the top surface of the second semiconductor module are substantially located at the same plane and can be exposed by the molding material. As such, the heat generated from the first semiconductor module and the second semiconductor module can be effectively dissipated via the top surface of the first semiconductor module and the top surface second semiconductor module.

Moreover, the first semiconductor module and the second semiconductor module are formed before forming the RDL module, so the RDL module can be directly formed on the first semiconductor module and the interconnection module (or the second semiconductor module) without solder joint. As such the process complexity is greatly reduced.

According to one embodiment, a semiconductor device is provided. The semiconductor device includes a redistribution layer (RDL) module, a first semiconductor module, an interconnection module, a second semiconductor module and a molding material. The first semiconductor module is disposed on the RDL module. The interconnection module is disposed on the RDL module. The second semiconductor module is disposed on the interconnection module. The molding material covers the RDL module and surrounds the first semiconductor module and the second semiconductor module. A top surface of the first semiconductor module and a top surface of the second semiconductor module are exposed by the molding material.

According to another embodiment, a semiconductor device is provided. The semiconductor device includes a redistribution layer (RDL) module, a first semiconductor module, a second semiconductor module, and a molding material. The first semiconductor module is disposed on the RDL module. The second semiconductor module is disposed on the RDL module. The molding material covers the RDL module and surrounds the first semiconductor module and the second semiconductor module. A top surface of the first semiconductor module and a top surface of the second semiconductor module are exposed by the molding material.

According to an alternative embodiment, a manufacturing method of a semiconductor device. The semiconductor device includes the following steps. A first semiconductor module and a second semiconductor module are provided. The first semiconductor module and the second semiconductor module are covered by a molding material. A redistribution layer (RDL) module is formed on the first semiconductor module and the second semiconductor module. The RDL module is connected with the first semiconductor module and the second semiconductor module through a plurality of copper bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:
   providing a first semiconductor module, an interconnection module and a second semiconductor module, wherein the interconnection module is electronically connected to the second semiconductor module;
   forming a redistribution layer (RDL) module, wherein the RDL module is connected with the first semiconductor module and the second semiconductor module through a plurality of copper bumps;
   filling an under-fill material such that the interconnection module is entirely embedded in the under-fill material; and
   covering the first semiconductor module and the second semiconductor module by a molding material.

2. The manufacturing method of the semiconductor device according to claim 1, wherein the interconnection module is detached from a removable adhesive film and a carrier and placed on a dicing frame with a dicing tape.

3. The manufacturing method of the semiconductor device according to claim 1, wherein
   the interconnection module is located between the semiconductor module and the RDL module.

4. The manufacturing method of the semiconductor device according to claim 1, wherein the interconnection module is jointed with the second semiconductor module.

5. The manufacturing method of the semiconductor device according to claim 1, wherein a top surface of the second semiconductor module and a top surface of the first semiconductor module are substantially located at the same plane.

6. The manufacturing method of the semiconductor device according to claim 1, wherein the under-fill material is filled to cover a plurality of solder balls of the second semiconductor module.

7. The manufacturing method of the semiconductor device according to claim 1, wherein the under-fill material covers a plurality of solder balls connected between the first semiconductor module and the RDL module.

8. A manufacturing method of a semiconductor device, comprising:

providing a first semiconductor module and a second semiconductor module;

covering the first semiconductor module and the second semiconductor module by a molding material, wherein the molding material is grinded to expose a plurality of a plurality of copper bumps electrically connected to the first semiconductor module and the second semiconductor module; and forming a redistribution layer (RDL) module connected to the first semiconductor module and the second semiconductor module, wherein the RDL module is connected with the copper bumps.

9. The manufacturing method of the semiconductor device according to claim 8, further comprising:

disposing the first semiconductor module and the second semiconductor module on a die attach film.

10. The manufacturing method of the semiconductor device according to claim 8, further comprising:

forming an interconnection module connected to the second semiconductor module.

11. The manufacturing method of the semiconductor device according to claim 10, wherein the interconnection module is jointed with the second semiconductor module.

12. The manufacturing method of the semiconductor device according to claim 10, wherein a top surface of the second semiconductor module and a top surface of the first semiconductor module are substantially located at the same plane.

13. The manufacturing method of the semiconductor device according to claim 10, wherein after forming the interconnection module on the second semiconductor module, an under-fill material is filled to cover a plurality of solder balls of the second semiconductor module.

14. The manufacturing method of the semiconductor device according to claim 8, wherein a removable adhesive film and a die attach film (DAF) are disposed on a carrier, and the first semiconductor module and the second semiconductor module are picked and placed on the die attach film.

15. A manufacturing method of a semiconductor device, comprising:

providing a first semiconductor module and a second semiconductor module;

forming an interconnection module connected to the second semiconductor module;

covering the first semiconductor module and the second semiconductor module by a molding material; and forming a redistribution layer (RDL) module on the first semiconductor module and the second semiconductor module, wherein the RDL module is connected with the first semiconductor module and the second semiconductor module through the interconnection module and a plurality of copper bumps;

wherein surfaces of the copper bumps and a surface of the molding material are directly connected.

16. The manufacturing method of the semiconductor device according to claim 15, further comprising:

disposing the first semiconductor module and the second semiconductor module on a die attach film, wherein the copper bumps connected to the first semiconductor module and the second semiconductor module are embedded in the die attach film; and curing the die attach film.

17. The manufacturing method of the semiconductor device according to claim 15, wherein the interconnection module is jointed with the second semiconductor module.

18. The manufacturing method of the semiconductor device according to claim 15, wherein a top surface of the second semiconductor module and a top surface of the first semiconductor module are substantially located at the same plane.

19. The manufacturing method of the semiconductor device according to claim 15, wherein after forming the interconnection module connected to the second semiconductor module, an under-fill material is filled to cover a plurality of solder balls of the second semiconductor module.

20. The manufacturing method of the semiconductor device according to claim 15, wherein a removable adhesive film and a die attach film (DAF) are disposed on a carrier, and the first semiconductor module and the second semiconductor module are picked and placed on the die attach film.

* * * * *